US007915608B2

(12) United States Patent
Hellings et al.

(10) Patent No.: US 7,915,608 B2
(45) Date of Patent: Mar. 29, 2011

(54) SCALABLE QUANTUM WELL DEVICE AND METHOD FOR MANUFACTURING THE SAME

(75) Inventors: Geert Hellings, Leuven (BE); Geert Eneman, Heverlee (BE); Marc Meuris, Keerbergen (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 85 days.

(21) Appl. No.: 12/463,338

(22) Filed: May 8, 2009

(65) Prior Publication Data
US 2009/0283756 A1 Nov. 19, 2009

Related U.S. Application Data

(60) Provisional application No. 61/052,869, filed on May 13, 2008.

(30) Foreign Application Priority Data

Nov. 7, 2008 (EP) .................................... 08168648

(51) Int. Cl.
*H01L 29/06* (2006.01)
(52) U.S. Cl. .................. 257/24; 257/194; 257/E29.249; 257/E29.25; 257/E29.251; 257/E21.403
(58) Field of Classification Search .................... 257/24, 257/194, E29.249, E29.25, E29.251, E29.252, 257/E21.403
See application file for complete search history.

(56) References Cited

U.S. PATENT DOCUMENTS

| 5,373,168 | A * | 12/1994 | Ando et al. ..................... 257/24 |
| 2005/0023555 | A1 | 2/2005 | Yoshida et al. |
| 2007/0045670 | A1 | 3/2007 | Kuraguchi |
| 2007/0102727 | A1 | 5/2007 | Twynam |
| 2007/0269968 | A1 | 11/2007 | Saxler et al. |

FOREIGN PATENT DOCUMENTS

| EP | 1 883 115 | 1/2008 |
| WO | WO2008/021544 | 2/2008 |

OTHER PUBLICATIONS

Cai, et al., "Enhancement-Mode AlGaN/GaN HEMTs with Low On-Resistance and Low Knee-Voltage" *IEICE Trans. Electron.* (2006) E89-C: 1025-1030.
European Search Report dated Jun. 25, 2009, issued in European Patent Application No. 08168648.7.

* cited by examiner

*Primary Examiner* — Zandra Smith
*Assistant Examiner* — Paul E Patton
(74) *Attorney, Agent, or Firm* — Knobbe Martens Olson & Bear LLP

(57) ABSTRACT

A quantum well device and a method for manufacturing the same are disclosed. In one aspect, the device includes a quantum well region overlying a substrate, a gate region overlying a portion of the quantum well region, a source and drain region adjacent to the gate region. The quantum well region includes a buffer structure overlying the substrate and including semiconductor material having a first band gap, a channel structure overlying the buffer structure including a semiconductor material having a second band gap, and a barrier layer overlying the channel structure and including an un-doped semiconductor material having a third band gap. The first and third band gap are wider than the second band gap. Each of the source and drain region is self-aligned to the gate region and includes a semiconductor material having a doped region and a fourth band gap wider than the second band gap.

11 Claims, 19 Drawing Sheets

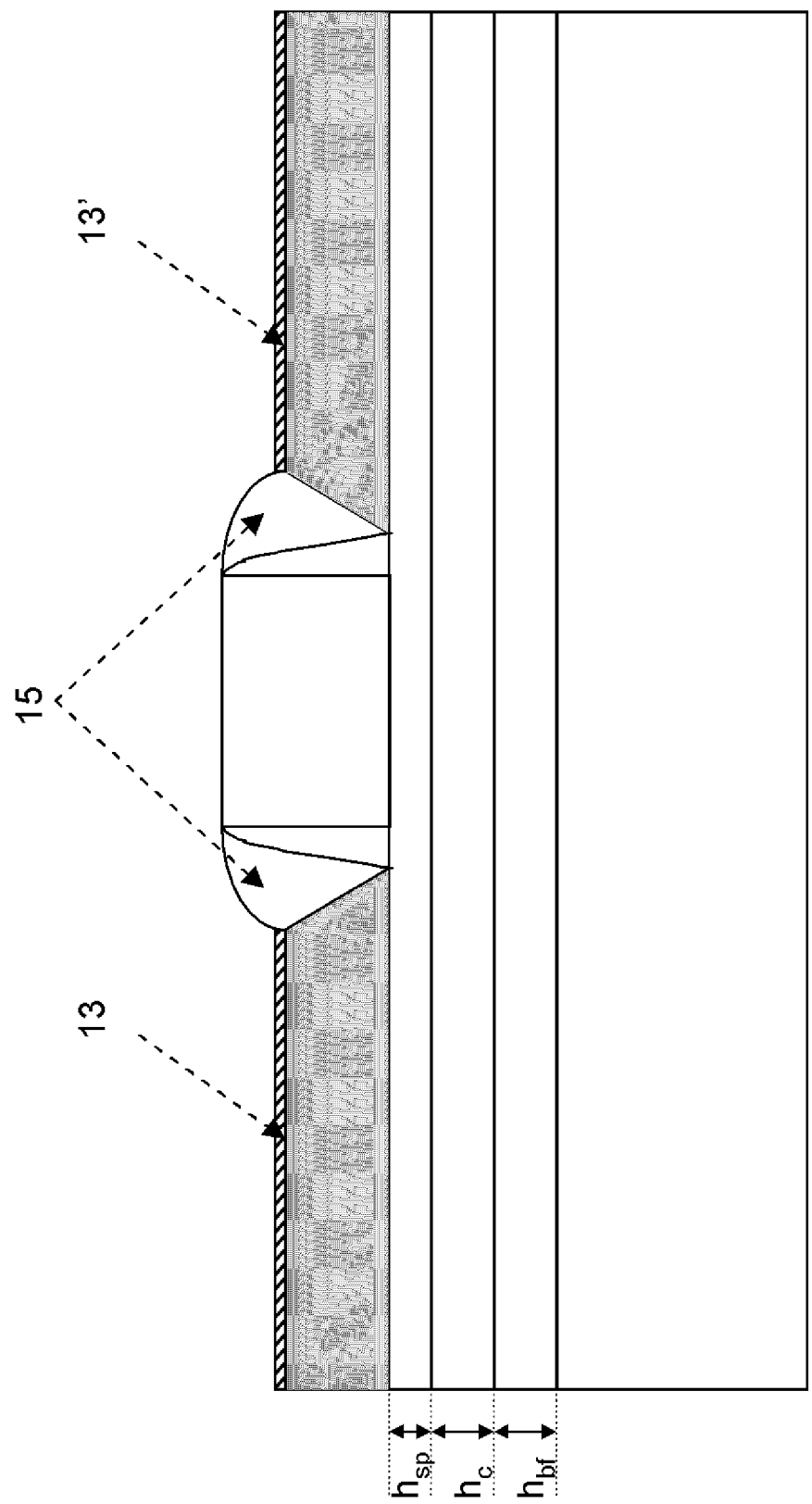

SCALABLE QUANTUM WELL DEVICE AND METHOD FOR MANUFACTURING THE SAME

CROSS REFERENCE TO RELATED APPLICATIONS

This application claims priority under 35 U.S.C. §119(e) to U.S. provisional patent application No. 61/052,869 filed on May 13, 2008, which application is hereby incorporated by reference in its entirety.

BACKGROUND OF THE INVENTION

1. Field of the Invention

The invention is related to semiconductor devices and methods of manufacturing semiconductor devices. Particularly, the invention is related to scalable quantum well devices and methods for manufacturing the same.

2. Description of the Related Technology

Continued physical scaling of mainstream silicon CMOS (complementary metal oxide semiconductor) technology has boosted the performance of the silicon devices in the last 40 years. However, even the benefits of the recently introduced new materials like high-k dielectrics and metal gates cannot guarantee that the race towards smaller devices will still be interesting in terms of performance enhancement beyond the 22 nm node.

A possible solution, at least for the next technology nodes, could be the introduction of new channel materials with higher carrier mobility. III-V compounds such as InSb, InAs, and InGaAs with high electron mobility are very promising materials and possible solutions for Si CMOS beyond 22 nm.

Besides their improved transport properties, the III-V compound semiconductors have also the advantage of well established manufacturing techniques used already in the fabrication of devices for microwave frequency communications and radar applications such as MESFET (metal epitaxial semiconductor field effect transistor), HEMT (high electron mobility transistor) and HBT (heterojunction bipolar transistor).

Device architectures inspired by the classical HEMT have been disclosed in the literature. However, the disclosed devices include recessed (cavity shaped groove) gate and/or T-shape gate configurations that are less suitable for scaling. Moreover, fabricating recess structures in the immediate vicinity of the gate and the channel layer can lead to damage which causes further performance loss or unstable operation of the device.

Therefore, despite the advances in the art, there is a need for providing a quantum well device with a scalable architecture for beyond 22 nm CMOS.

BRIEF DESCRIPTION OF THE DRAWINGS

All drawings are intended to illustrate some aspects and embodiments of the present invention. The drawings described are only schematic and are non-limiting.

FIG. 2(C) represents schematically the device of FIG. 2(A), further comprising self-aligned S/D contacts (13, 13') overlying the upper surface (11a) of the semiconductor material comprising the uniformly doped region (11); (15)—second pair of insulating sidewall spacers.

FIG. 10(*b*) represents the structure without a gate used to perform the simulations shown in graph 10(*a*).

DETAILED DESCRIPTION OF CERTAIN ILLUSTRATIVE EMBODIMENTS

Figure 1A:
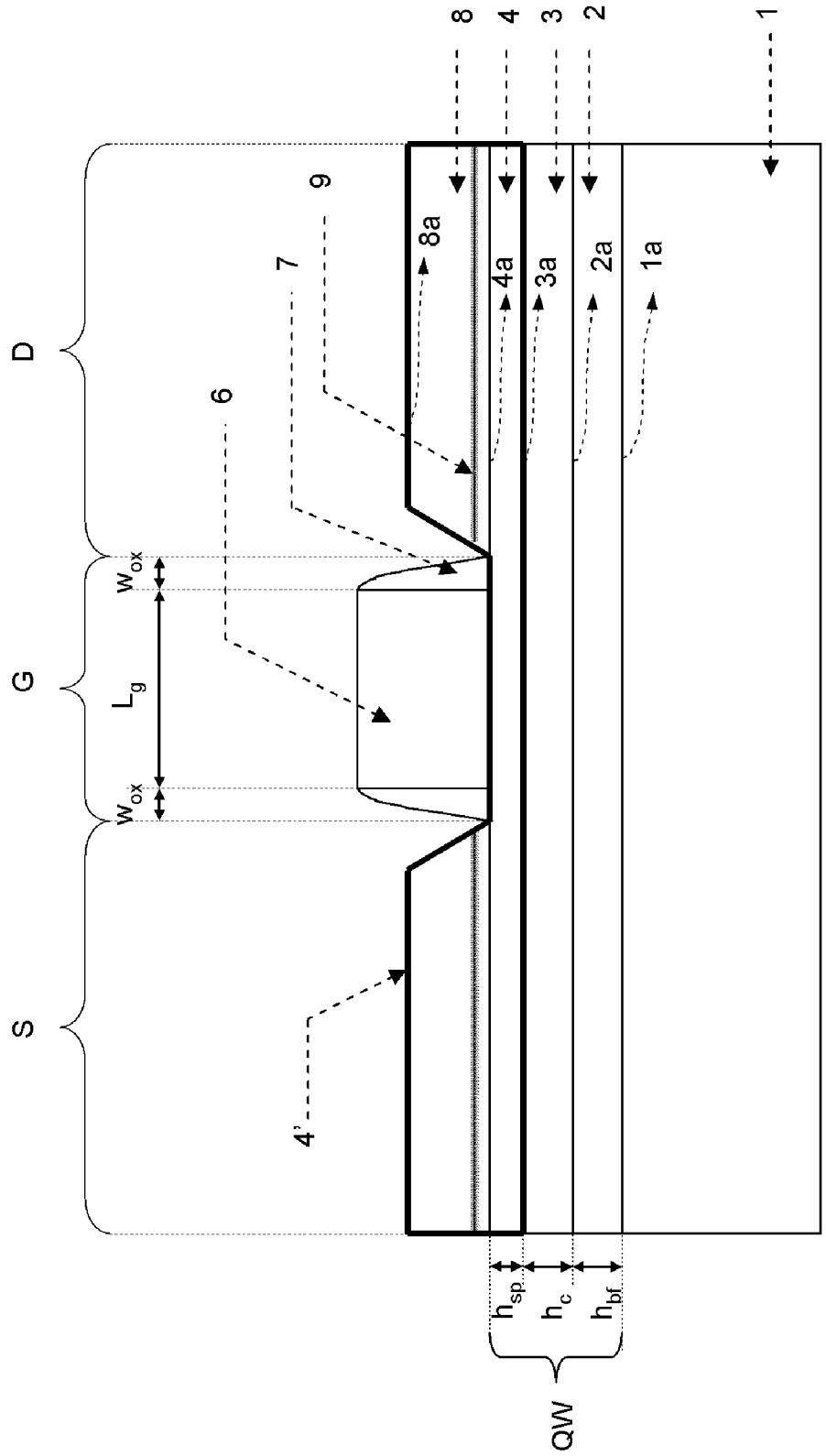
FIG. 1(A) represents schematically a cross section through a quantum well (QW) device according to one embodiment: (1)—substrate; (1a)—upper surface of the substrate; (S)—source region; (G)—gate region; (D)—drain region; (QW)—quantum well region; (2)—buffer structure; (2a)—upper surface of the buffer structure; (3)—channel structure; (3a)—upper surface of the channel structure; (4)—barrier layer; (4a)—upper surface of the barrier layer; (4')—barrier structure; (6)—gate electrode; (7)—first pair of insulating sidewall spacers; (8)—semiconductor material with a fourth band gap; (8a)—upper surface of the semiconductor material (8); (9)—δ-doping layer.

Field effect devices such as field effect transistors (FET) are basic components in most digital and many analog circuits, including circuits for data processing and telecommunications.

Field effect devices typically comprise a conductive path between a source region and a drain region. The channel (a region of the path between the source and the drain) is controlled by the electric field produced by a gate electrode.

In the case of an e.g. n-channel depletion-mode device (or a device "normally ON"), when no voltage is applied to the gate, current can flow from the source through the channel to the drain. If a sufficient negative voltage is applied to the gate, the channel region is depleted of carriers and the source-drain current is reduced or completely cut-off. In the case of an e.g. n-channel enhancement-mode device (or a device "normally OFF"), when a positive gate to source voltage is applied, a conductive channel is created within the transistor. The positive voltage attracts free-floating electrons within the body towards the gate, forming a conductive channel. First, enough electrons must be attracted near the gate to counter the dopant ions added to the body of the FET, which forms a region free of mobile carriers (a depletion region) and the corresponding voltage is referred to as the threshold voltage of the FET. CMOS is a typical example of an enhancement-mode device, while in the case of HEMT both operating modes are possible.

The operating frequency (the speed of such a device when employed as a switch) is determined by the length the gate-channel region. The requirement for higher operating frequencies together with the requirement for enhanced device density on a chip is the determining factor for device scaling.

A HEMT (high electron mobility transistor) is a field effect transistor incorporating a junction between two materials with different band gaps (i.e. a heterojunction or heterostructure) as channel instead of a doped region, as is generally the case for MOSFETs. A commonly used material combination is GaAs with AlGaAs, though there is wide variation, dependent on the application of the device.

The physical principles behind the operation of an HEMT transistor are further explained. In general, to allow conduction, semiconductors need to be doped with impurities to generate mobile electrons. However, this causes electrons to slow down because they end up colliding with the impurities which were used to generate them. State of the art HEMT resolves this contradiction by use of high mobility electrons generated using the heterojunction of a highly-doped wide-bandgap n-type donor-supply layer (e.g. AlGaAs) and a non-doped narrow-bandgap channel layer (e.g. GaAs). The electrons generated in the n-type AlGaAs thin layer drop completely into the channel layer (GaAs), because the heterojunction created by different band-gap materials forms a quantum well (QW) in the conduction band on the GaAs side, where the electrons can move quickly without colliding with any impurities. The effect of this phenomenon is a very thin layer of highly mobile conducting electrons with very high concentration, giving the channel low resistivity (or high electron mobility). This layer is also known as a two-dimensional electron gas (2-DEG). As in the case of other types of FETs, a voltage applied to the gate electrode alters the conductivity of this layer. Analog, in the case of HHMT (high hole mobility transistor), a very thin layer of highly mobile conducting holes appears with very high concentration, giving the channel low resistivity (or high holes mobility). When referring to both HEMT and HHMT, the thin layer of highly mobile carriers is also known as a two-dimensional carrier gas.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

The term 'III-V compound semiconductor' denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors include, but are not limited to alloys of GaAs, InP, InSb, InGaAs, AlGaAs, InAlAs, InAlAsSb, InAlAsP and InGaAsP.

The term 'band gap' refers to the energy difference between the top of the valence band and the bottom of the conduction band. In general, a wide band gap (WBG) semiconductor is a semiconductor material with an electronic band gap larger than 1 eV and, preferably, larger than 2 eV. In general, a narrow band gap (NBG) semiconductor is a semiconductor material with an electronic band gap smaller than 1 eV and, preferably, smaller than 0.6 eV. However, the absolute ranges described above are only informative, since it is rather the relative difference between the WBG and NBG that will determine the good working of the device, than the actual absolute value of the band gap.

The term "semiconductor" denotes a material with a resistivity of about 105 Ω.cm (e.g. intrinsic Si has a resistivity of about 240 kΩ.cm), while a "semi-insulator" denotes a material with a higher resistivity value, of about 109 Ω.cm.

The dielectric material having a dielectric constant of greater than 3.9 (k value of SiO2) is referred to herein as a high-k dielectric. Typically, a high-k dielectric has a dielectric constant of about 7.0 or greater, with a dielectric constant of about 10.0 or greater being even more typical.

The invention will now further be described by a detailed description of several particular embodiments of the invention. It is clear that other embodiments of the invention can be configured according to the knowledge of persons skilled in the art without departing from the true spirit or technical teaching of the invention.

In operation, through the channel structure of a HEMT flows a two dimensional electron gas (2-DEG). In the traditional approach, the electrons are supplied by a δ-doping layer (containing donor species) in the adjacent barrier layer/structure (see FIG. 6a).

Certain embodiments are related to scalable quantum well (QW) devices and methods of manufacturing the same. Described in the most general way, the device of one embodiment is a quantum well device comprising:

a substrate (1), a buffer structure (2) overlying and in contact with the substrate (1), the buffer structure comprising a semiconductor material having a first band gap, a channel structure (3) overlying and in contact with the buffer structure (2), comprising a semiconductor material having a second band gap, a barrier structure (4') overlying and in contact with the channel structure (3), comprising a semiconductor material having a third band gap, and further comprising a doping material, suitable for forming a 2-dimensional carrier gas, when the QW device is in operation, a gate region (G) overlying a portion of the barrier structure, and comprising a gate electrode (6), source and drain contacts (10,10',13,13'), wherein the first and the third band gap are wider than the second band gap, and wherein no doping material is present in the portion of the barrier structure (4') located underneath the gate region. According to the preferred embodiment, the dimensions of the portion measured in the plane of the substrate (i.e. lateral dimensions, i.e. width and length and not thickness) correspond to the dimensions of the gate region. In the case of the device of FIG. 6, the gate region is defined by the gate electrode ($L_g$) and the two insulating sidewall spacers ($w_{ox}$).

Figure 6:
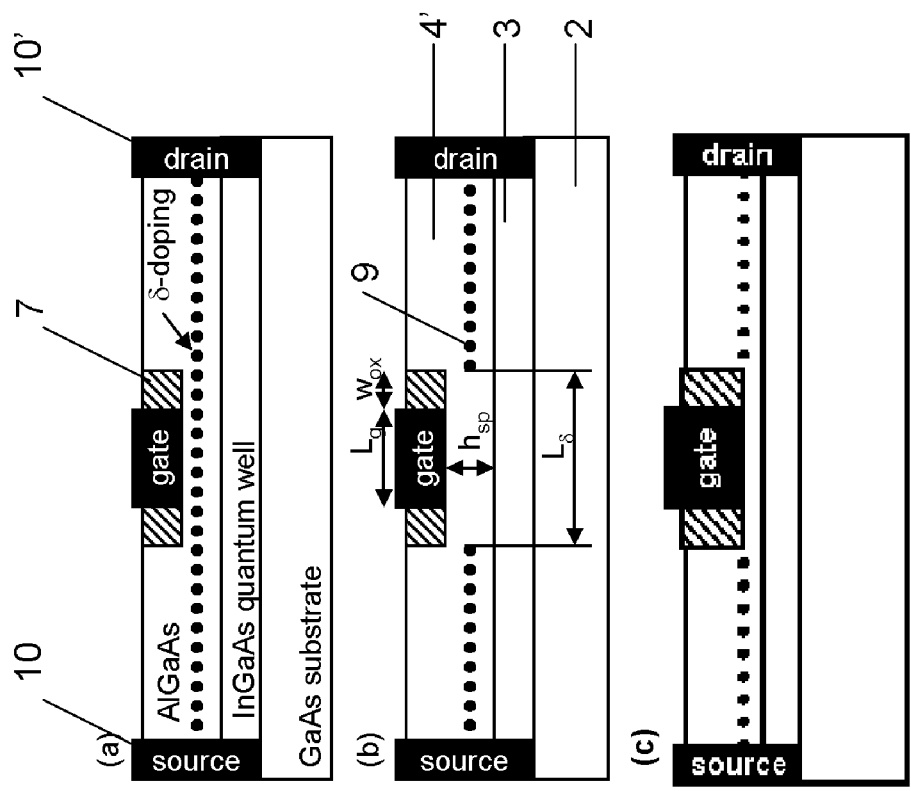
FIG. 6 represents schematically the simulated QW device (a) HEMT structure with continuous δ-doping layer; (b) HEMT with interrupted δ-doping layer according to one embodiment; (c) HEMT with interrupted δ-doping layer and scaled EOT (Equivalent Oxide Thickness), according to one embodiment.

As seen in FIG. 6, the device may have a configuration similar to a HEMT-device (or HHMT-device), comprising buffer layer 2, channel layer 3 and barrier structure 4'. FIG. 6a shows schematically such a device, wherein the barrier structure is provided with a continuous δ-doping layer over the whole surface of the device. The device comprises a gate electrode 6, insulating sidewall spacers 7 as well as source and drain ohmic contacts 10, 10'.

FIG. 6b shows a QW device according to one embodiment, wherein the δ-doping layer is interrupted in the region underneath the gate, preferably corresponding to the combined width of the gate and the spacers. As no doping layer is present underneath the gate, the height $h_{sp}$ of the barrier may be reduced in that region (as illustrated in FIG. 6c).

According to the preferred embodiment shown in FIG. 1A, the device of one embodiment comprises self-aligned source and drain regions 8, i.e. semiconductor regions adjacent the encapsulated (with spacers 7) gate electrode 6 and on top of a barrier layer 4, wherein the barrier layer itself is not doped, but the source and drain regions are doped, for example with a δ-doping layer. The 'barrier structure' 4' is then formed by the undoped barrier layer 4 and the doped source/drain regions (see thick line in FIG. 1A). The result is the same as in FIG. 6b, i.e. no doping material is present under the gate region. In the present description, the 'quantum well region' is defined as the region formed of layers 2, 3 and 4 in the embodiment with doped and self-aligned source and drain regions (FIG. 1A). It is to be noted that the barrier layer 4 is undoped, which is to be understood as follows no doping is deliberately added to the layer. However, in the finished device, doping material may have diffused from the source/drain regions into the layer 4. Also in this case however, no doping material is present underneath the gate region.

Various embodiments of the present invention disclose a device comprising an un-doped barrier layer and a doping layer/doped region comprised in the self-aligned source/drain regions adjacent to the gate region, the gate/source/drain regions overlying the barrier layer. Advantageously, shallow self-aligned source and drain contacts are formed on the upper surface of the source and drain regions.

In one embodiment, the source to drain spacing is reduced, being equal with the sum of the gate length and the insulating sidewall spacer width on both sides of the gate. Therefore, in one embodiment, the very compact, self-aligned design is suitable for scaling and is an advantage since it allows reducing the device capacitance and consequently, increasing the operating frequency. Another advantage is that by interrupting the δ-doping layer (or the doped region, as shown further) and placing it outside the barrier layer, the thickness of the barrier layer can be scaled further towards lower values (lower EOT), suitable for gate lengths below 100 nm. This is not possible in a classical HEMT structure where a δ-doping layer is present between the gate and the QW structure, preventing the barrier thickness to be further reduced/scaled.

In a first aspect of the present invention a quantum well device is disclosed comprising a substrate (1), a quantum well region (QW) overlying the substrate, a gate region (G) overlying the quantum well region, a source region (S) and a drain region (D) adjacent to the gate region, wherein the quantum well region comprises:
a buffer structure (2) overlying and in contact with the substrate (1), the buffer structure comprising a semiconductor material having a first band gap,
a channel structure (3) overlying and in contact with the buffer structure (2), comprising a semiconductor material having a second band gap,
a barrier layer (4) overlying and in contact with the channel structure (3), comprising an un-doped semiconductor material having a third band gap, wherein the first and the third band gap are wider than the second band gap, and the source region (S) and the drain region (D) are each self-aligned to the gate region (G) and comprise a semiconductor material (8) having a fourth band gap and a doped region, wherein the fourth band gap is wider than the second band gap.

The quantum well region (QW), as defined in the embodiment of FIG. 1, comprises three structures: the buffer structure (2), the channel structure (3) and the barrier layer (4). Each of these structures can comprise one or more layers.

In different embodiments of the present invention, the buffer structure (2) comprises a semiconductor or semi-insulator material having a first band gap, wherein the first band gap is wider than the second band gap of the semiconductor material used to fabricate the channel structure (3). Typically the semiconductor/semi-insulator material having a first band gap is a wide band gap (WBG) material, as defined elsewhere in the text.

Alternatively, the buffer structure (2) can comprise multiple layers, each of the layers consisting of a semiconductor or semi-insulator material with a wide band gap.

In different embodiments of the present invention, the channel structure (3) comprises an un-doped semiconductor material having a second band gap, wherein the second band gap is narrower than the first and the third band gap of the semiconductor material used to fabricate the buffer (2) and the barrier (4) structure, respectively. Typically the semiconductor material having a second band gap is a narrow band gap (NBG) semiconductor material, as defined elsewhere in the text.

Alternatively, the channel structure (3) can comprise multiple layers, each of the layers consisting of a semiconductor material with a narrow band gap. In a particular embodiment of this invention, the channel structure can comprise three layers, a bottom layer overlying and in contact with the buffer structure (2), a top layer underlying and in contact with the barrier layer (4) and a mid layer sandwiched in between the bottom and the top layers. Each of the top and the bottom layers comprises a material selected to minimize the interface defects, while the mid layer comprises a material selected to enhance the mobility. In practice, a gradual doping with Indium (e.g. a stack comprising InGaAs/InAs/InGaAs) can show the above described functionality.

Advantageously the channel structure/layer (3) has a thickness (hc, FIG. 1(A)) of about 3 to 20 nm. Preferably, the channel structure/layer has a thickness of about 7 nm.

In different embodiments of the present invention, the barrier layer (4) comprises an un-doped semiconductor material having a third band gap, wherein the third band gap is wider than the second band gap of the semiconductor material used to fabricate the channel structure/layer (2). Typically the semiconductor material having a third band gap is a wide band gap (WBG) semiconductor material, as defined elsewhere in the text.

Alternatively, the barrier layer 4 can comprise multiple layers, each of the layers consisting of a semiconductor material with a wide band gap. Advantageously the barrier layer is very thin (about 1-20 monolayers), made of an un-doped (i.e. no deliberate addition of doping, see above) semiconductor material and perfectly lattice matched with the underlying channel structure. A thin, un-doped and lattice matched barrier layer allows good control over the channel structure, minimizes the interface scattering at the interface with the gate electrode and preserves the transport properties of the carriers in the channel. Preferably, the barrier layer 4 can have a thickness (hsp in FIG. 1(A)) between about 5 Angstrom and 2 nm. More preferably the barrier layer has a thickness of about 3 Angstrom.

In one embodiment, the gate region (G) comprises a gate electrode (6) overlying the barrier layer (4) and a first pair of insulating sidewall spacers (7) on both sides of the patterned gate electrode. In this case, the dimensions of the gate region correspond to the combined dimensions of the gate electrode and the spacers. Patterning a gate electrode first, followed by forming self-aligned source and drain regions comprising a doping layer/region has the advantage of reduced overlap gate-source/drain capacitance and low resistance in the source/drain regions. By lowering the gate to source/drain overlap capacitance the switching speed of the device is improved.

Advantageously, the first pair of insulating sidewall spacers are preventing the dopants from the doping layer/region comprised in the S/D regions to diffuse under the gate region. The dopants may diffuse in the underlying barrier layer under the source and drain region. On each side of the gate electrode, the thickness of the insulating sidewall spacer is lower or equal to about 5 nm and, more preferably, lower or equal with about 4 nm.

In another embodiment of the first aspect of the present invention, the doped region consists of a doping layer (9). Preferably, the doping layer can be a delta-doping layer, consisting of at least 1 monolayer of dopants.

Figure 2A:
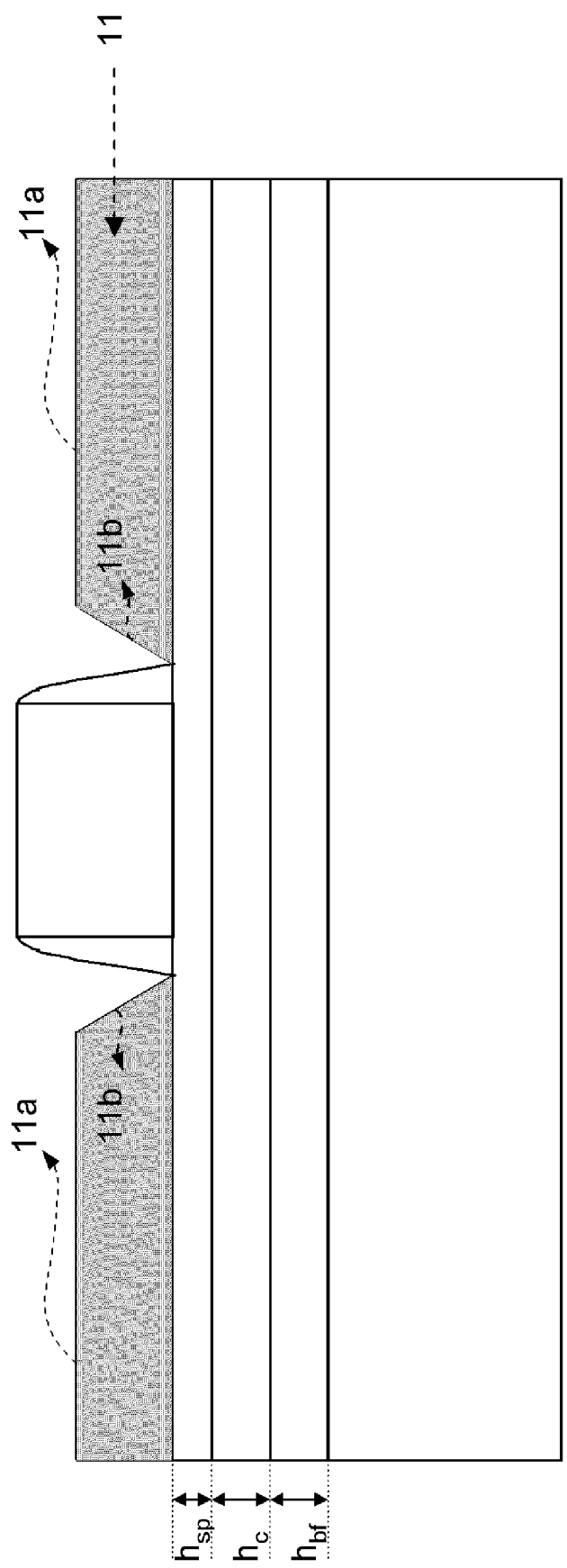
FIG. 2(A) represents schematically the device of FIG. 1(A), wherein the δ-doping layer (9) is replaced by a uniformly doped region (11) in the semiconductor material (8); (11a)—upper surface of the semiconductor material comprising the uniformly doped region (11); (11b)—lateral (faceted) surface of the semiconductor material comprising the uniformly doped region (11).
Figure 2B:
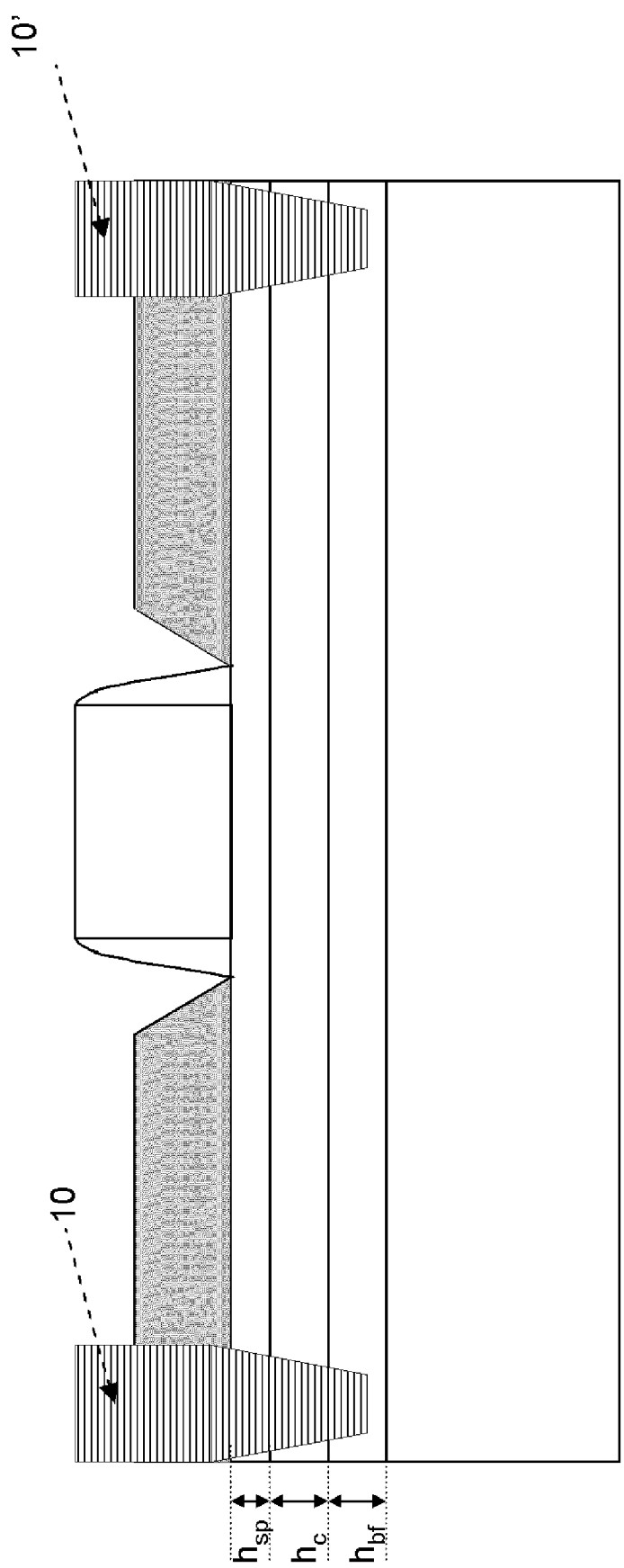
FIG. 2(B) represents schematically the device of FIG. 2(A), further comprising S/D ohmic contacts (10, 10').

In an alternative embodiment of the first aspect of the present invention, the doped region is uniformly doped (11) as shown in FIG. 2(A).

Figure 3A:
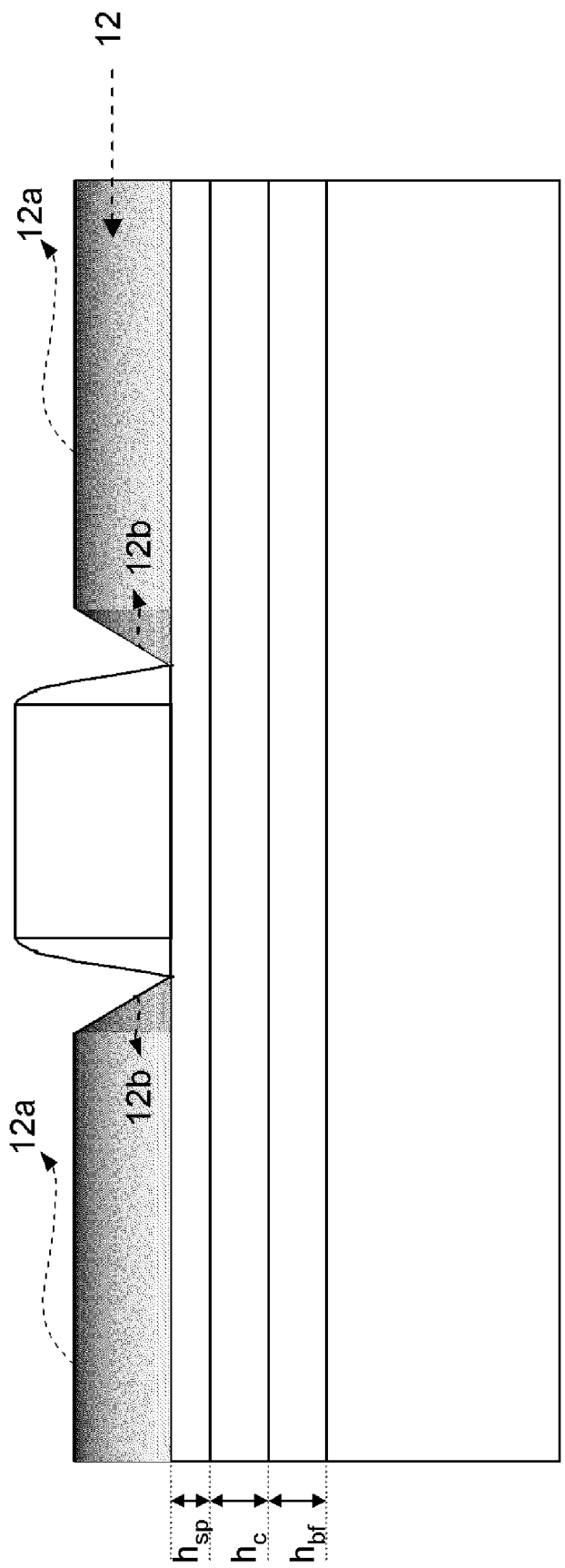
FIG. 3(A) represents schematically the device of FIG. 1(A), wherein the δ-doping layer (9) is replaced by a gradually doped region (12) in the semiconductor material (8); (12a)—upper surface of the semiconductor material comprising the gradually doped region (12); (12b)—lateral (faceted) surface of the semiconductor material comprising the gradually doped region (12).
Figure 3B:
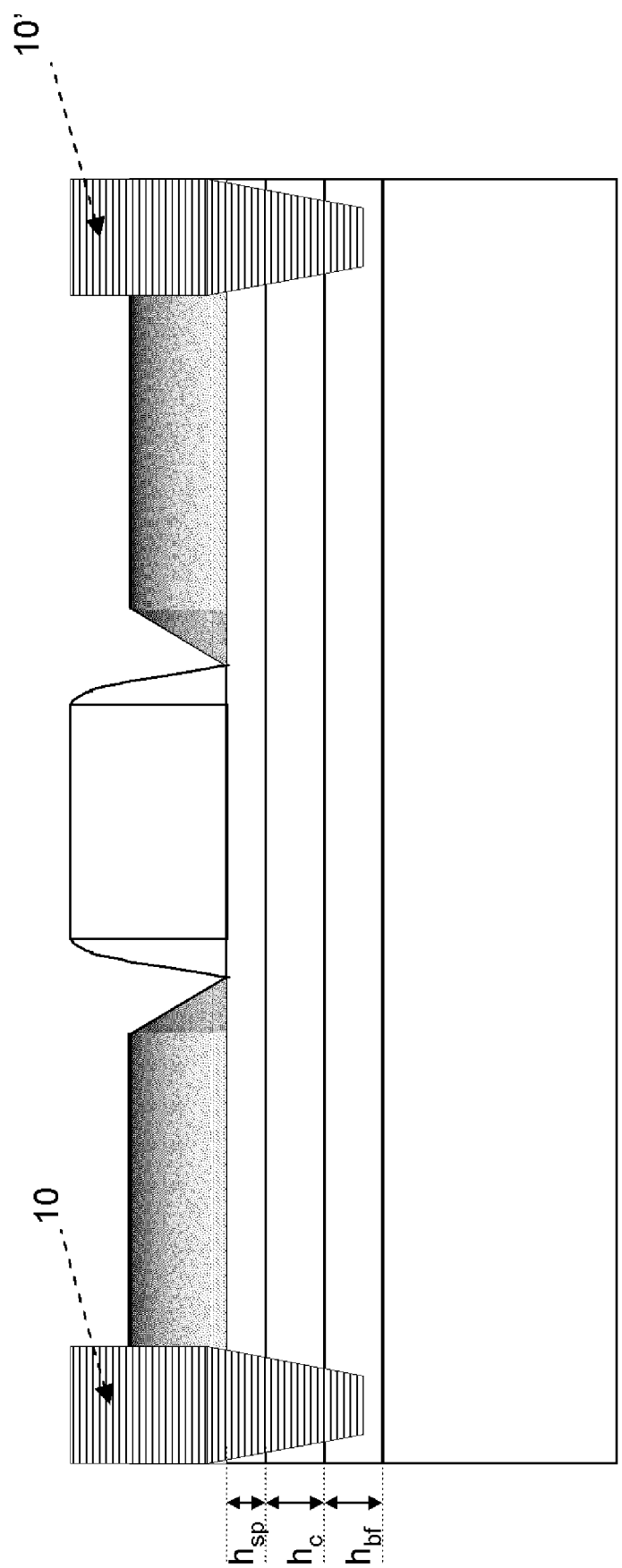
FIG. 3(B) represents schematically the device of FIG. 3(A), additionally comprising (10, 10')—S/D ohmic contacts (10, 10').

In another alternative embodiment of the first aspect of the present invention, the doped region is gradually doped (12) with dopants, with the highest dopants concentration at the upper surface (12a) as shown in FIG. 3(A).

Figure 4A:
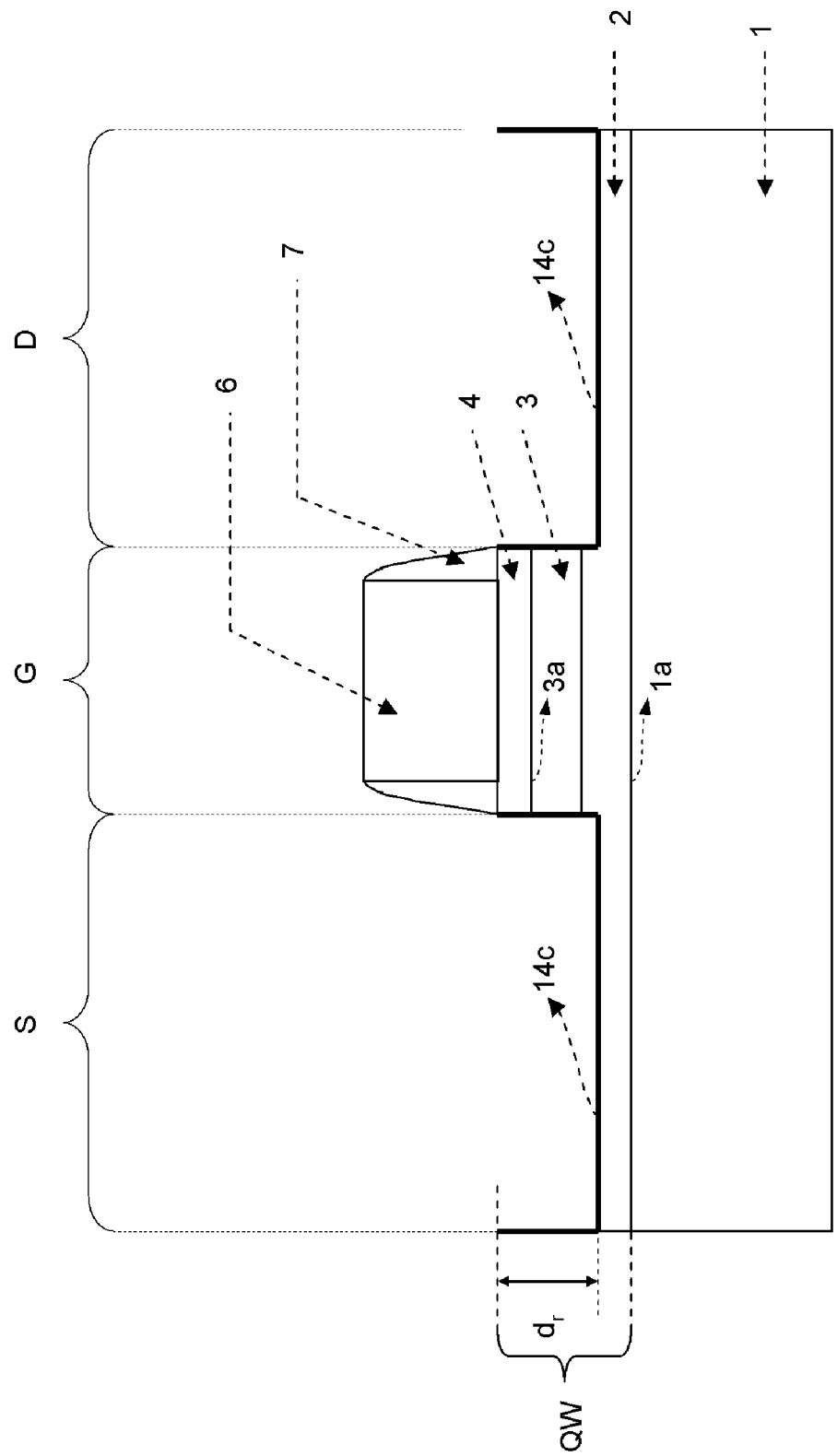
FIG. 4(A) represents schematically a cross section through a QW device comprising recessed S/D regions; (14c)—bottom surface of the recessed S/D regions.
Figure 4B:
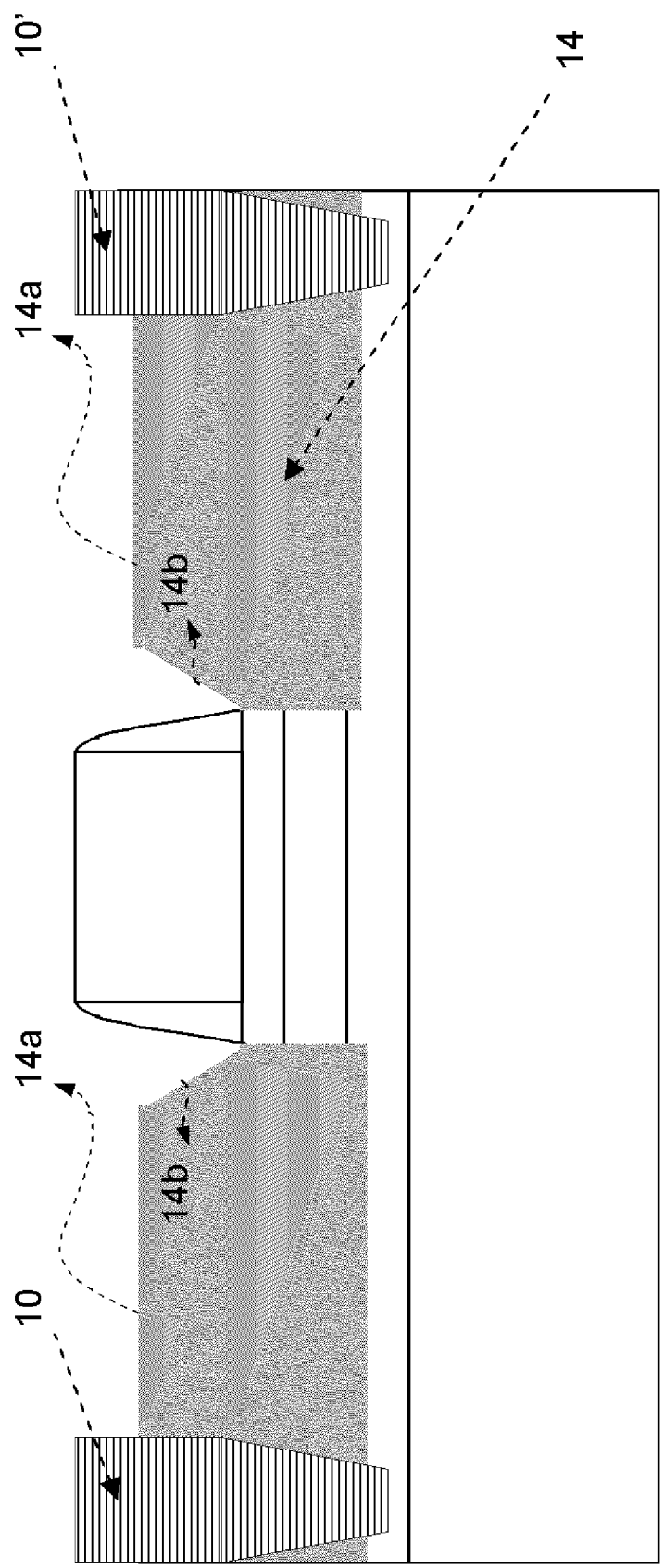
FIG. 4(B) represents schematically a cross section through a QW device comprising recessed S/D regions filled with a re-grown doped semiconductor material (14); (14a)—upper surface of the re-grown doped semiconductor material (14); (14b)—lateral (faceted) surface of the re-grown semiconductor material; (10, 10')—S/D ohmic contacts.

In an alternative embodiment of the first aspect of the present invention, the source region (S) and the drain region (D) are recessed regions defined in the quantum well region (QW) as shown in FIG. 4(A). The depth of the recess (dr) is higher than the distance from the top edge of the recess (corresponding to the upper surface of the QW region) to the upper surface of the channel structure (3a) and lower than the distance from the top edge of the recess to the bottom surface of buffer structure (1a).

Figure 1B:
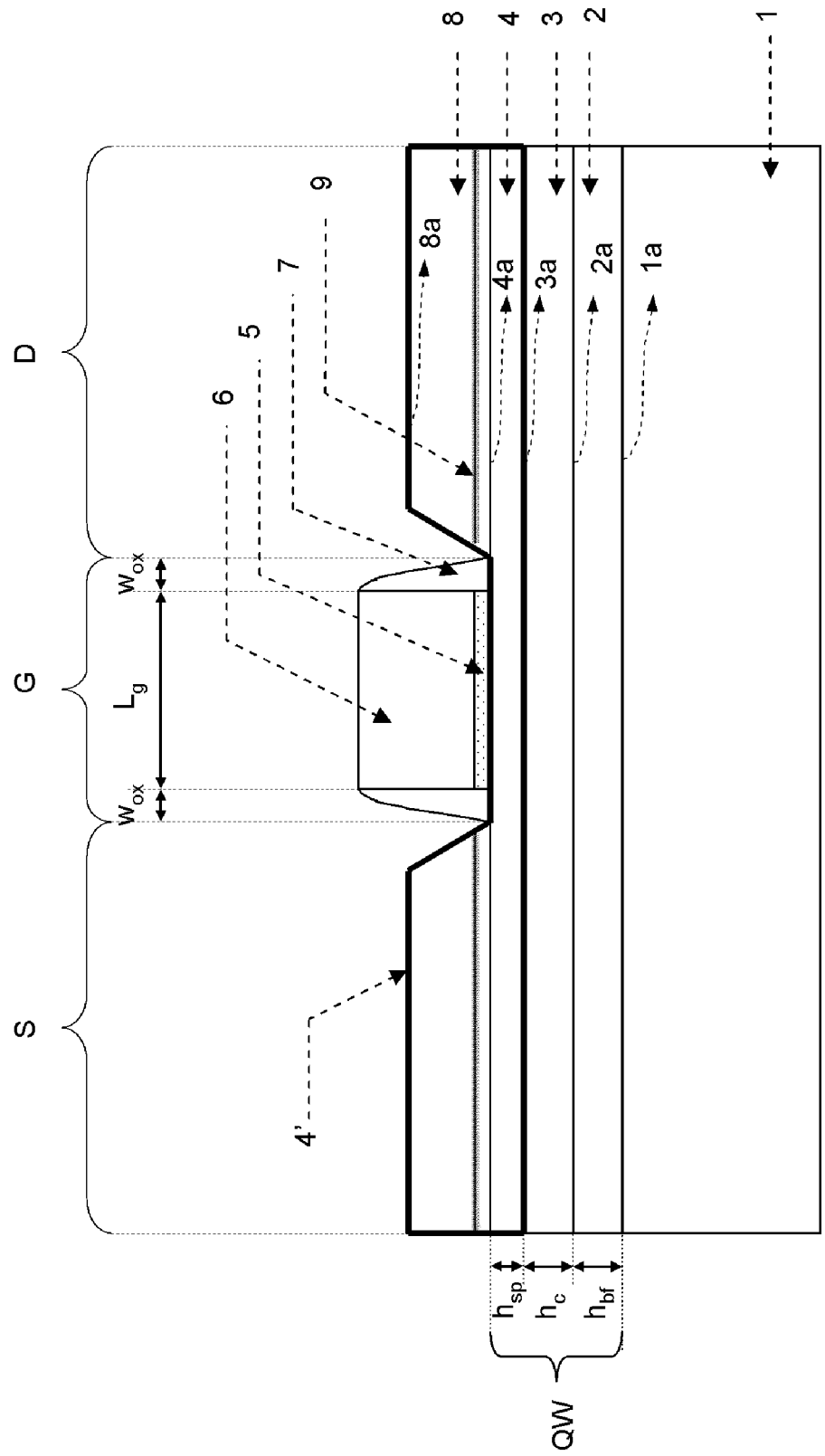
FIG. 1(B) represents schematically the device of FIG. 1(A), further comprising (5)—gate oxide.
Figure 1C:
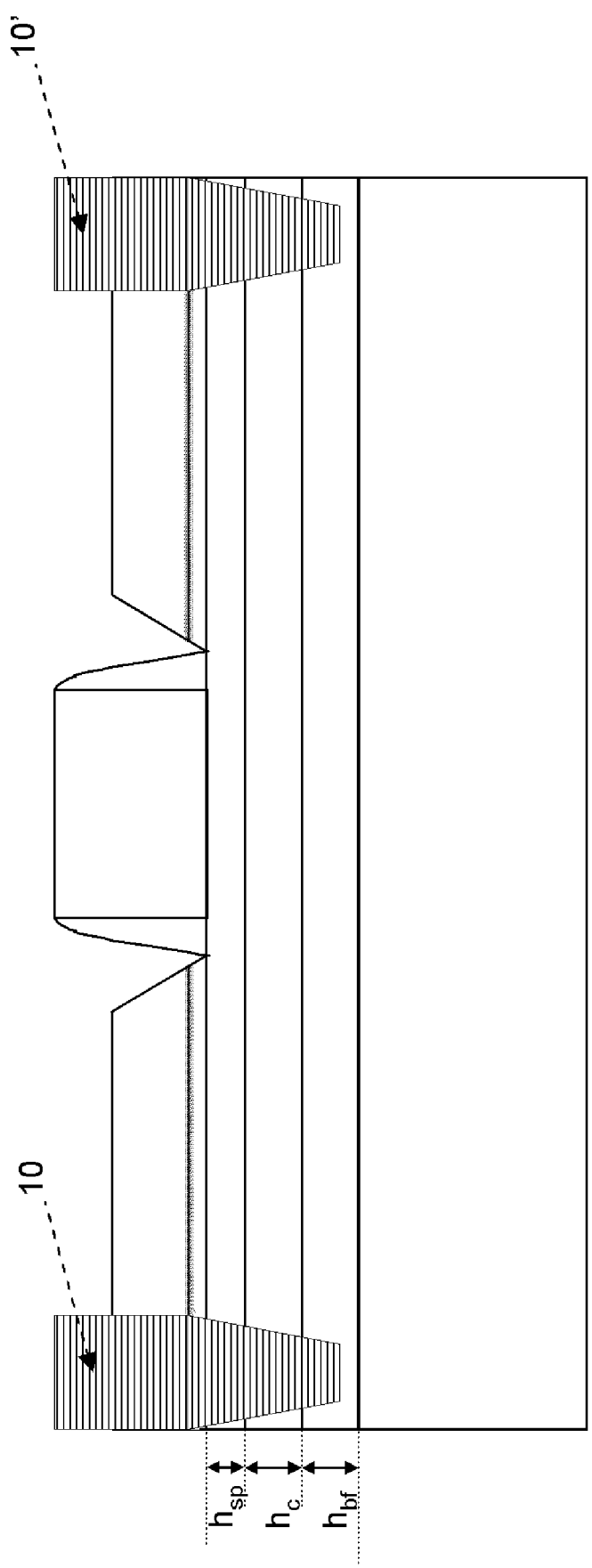
FIG. 1(C) represents schematically the device of FIG. 1(A), further comprising (10, 10')—S/D ohmic contacts.

In different embodiments of the present invention, the gate region (G) comprises further a gate dielectric (5) sandwiched in between the barrier layer (4) and the gate electrode (6), as shown in FIG. 1(B). The presence of the gate dielectric improves the QW device performance by reducing the gate leakage.

Advantageously, the gate dielectric (5) comprises a high-k dielectric. The high-k dielectric employed in one embodiment includes, but is not limited to an oxide, nitride, oxynitride and/or silicates including metal silicates, aluminates, titanates and nitrides. Preferably, the high-k dielectric can comprise HfO2, HfSiO, ZrO2, Al2O3, TiO2, Lanthanide-based oxides (i.e. La2O3, GdGaO), Y2O3, Ga2O3, perovskites (i.e. SrTiO3) or combinations thereof.

Additionally, the gate region of the QW device can comprise a passivation layer (not shown) underlying the high-k material (5), wherein the passivation layer can be formed by performing a pre-treatment (cleaning/UV-exposure/short deposition process) on the barrier layer (4).

Figure 3C:
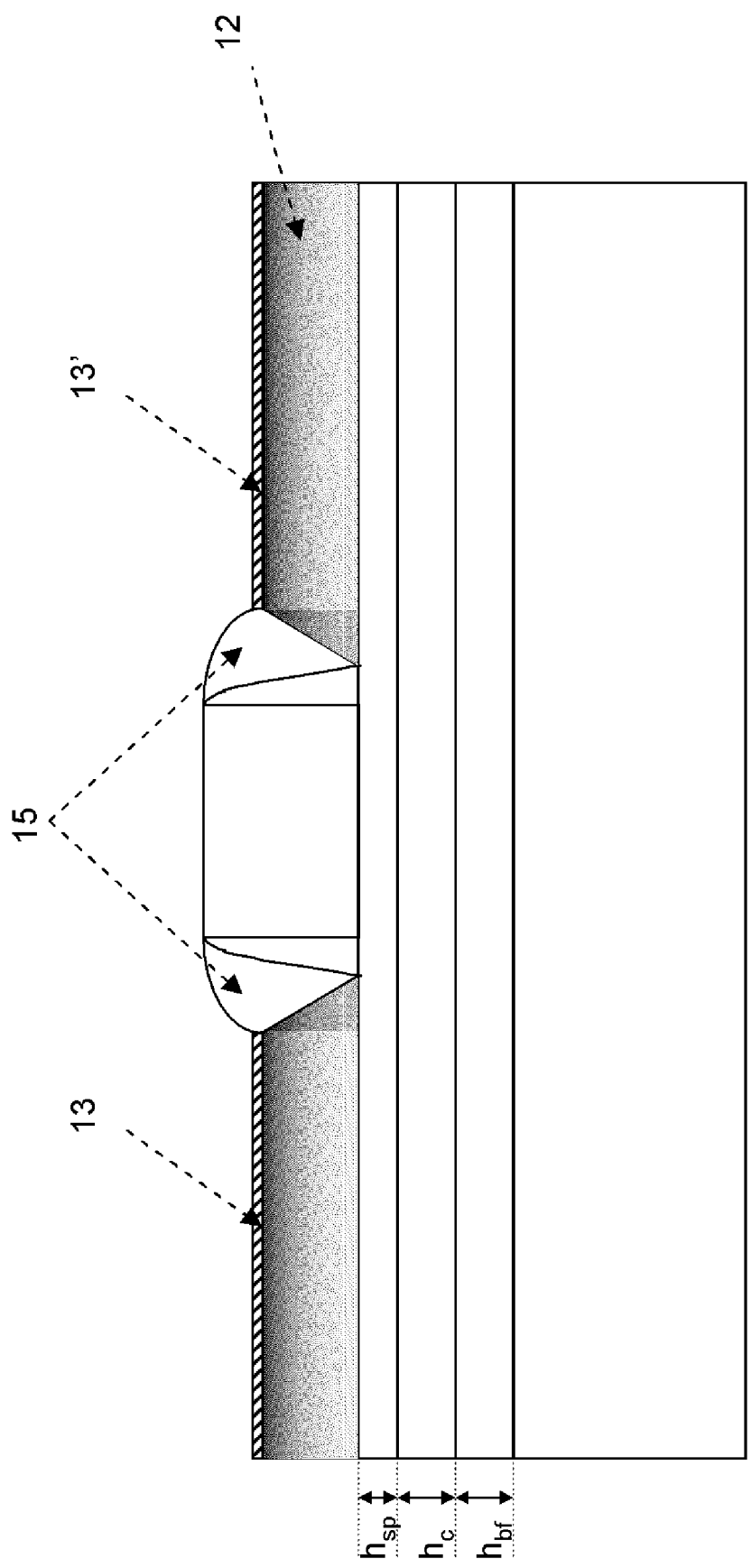
FIG. 3(C) represents schematically the device of FIG. 3(A), additionally comprising self-aligned S/D contacts (13, 13') overlying the upper surface (12a) of the semiconductor material comprising the gradually doped region (12); (15)—second pair of insulating sidewall spacers.
Figure 4C:
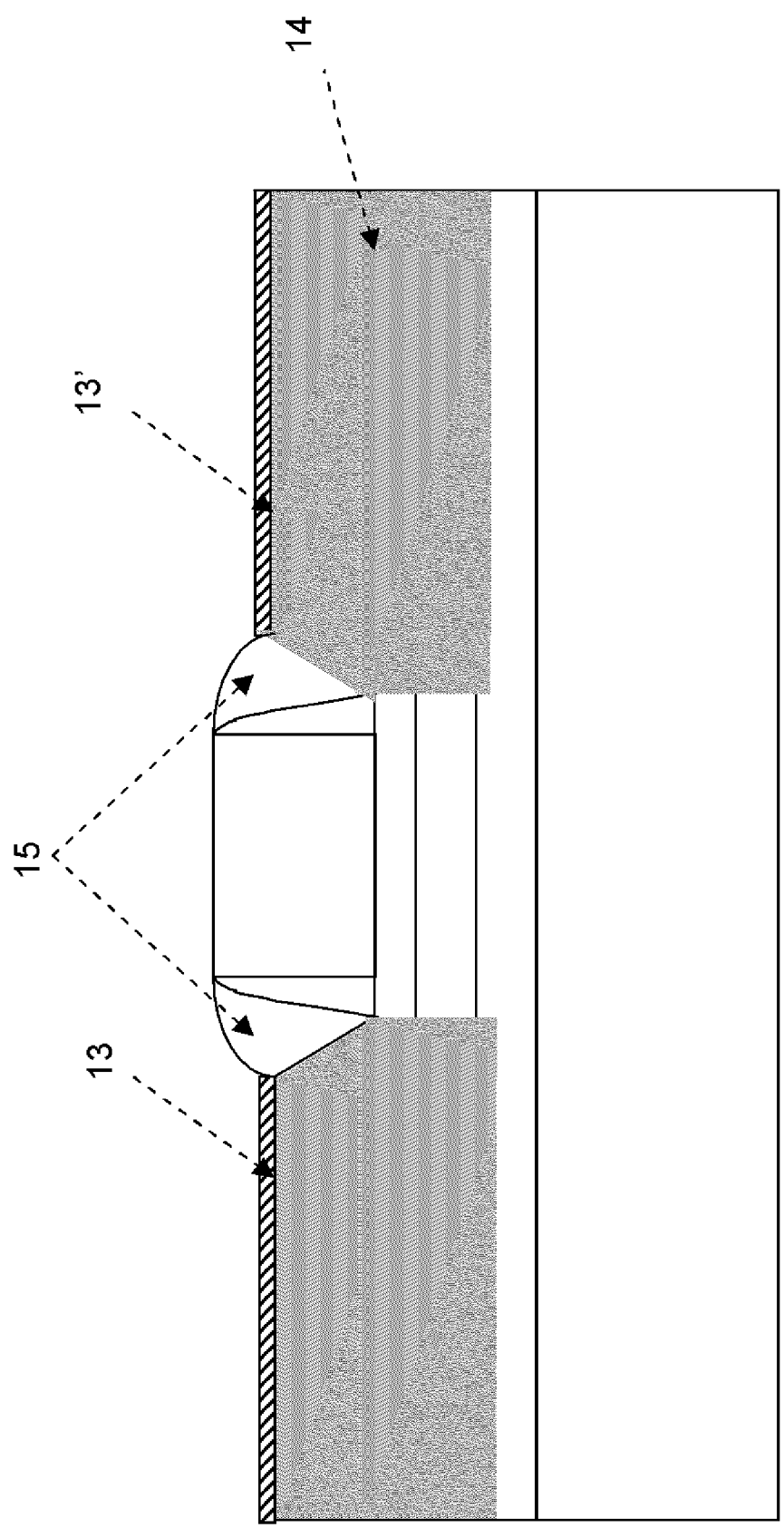
FIG. 4(C) represents schematically the device of FIG. 4(B) without S/D ohmic contacts, additionally comprising self-aligned S/D contacts (13, 13') overlying the upper surface (14a) of the re-grown doped semiconductor material (14); (15)—second pair of insulating sidewall spacers.

In different embodiments of the first aspect of the present invention the QW device comprises further a second pair of insulating sidewall spacers (15) overlying any faceted regions (11b, 12b, 14b) of the self aligned source and drain regions near the gate edge and self-aligned source and drain shallow contacts (13, 13'), overlying the upper surface (8a, 11a, 12a, 14a) of respectively the source region (S) and the drain region (D). These embodiments are illustrated in FIGS. 2(C), 3(C) and 4(C). The self aligned source and drain shallow contacts (13, 13') comprise a metal silicide or a metal germanide or a metal-III-V compound. The shallow contacts have the advantage of lower source and drain resistance, increasing in this way the operational speed of the QW device. Moreover, the shallow contacts are suitable options for scaling.

In alternative embodiments, the QW device comprises further source and drain ohmic contacts (10, 10') as shown in FIGS. 1(C), 2(B), 3(B), 4(B), 6(b) and 6(c). The ohmic contacts can comprise a metal, an alloyed metal, metal nitride or a metal silicide/germanide. In specific embodiments the ohmic contacts can comprise W, Al, Ti, Ta, Pt or Au-based alloys like NiAuGe.

In embodiments of the present invention the semiconductor material with the first band gap, the semiconductor material with the third band gap and the semiconductor material with the fourth band gap are wide band gap semiconductors (WBG). Preferably the fourth band gap may be still wider than the third band gap.

In particular embodiments of the present invention the WBG semiconductor material is selected from the group consisting of AlGaAs, AlGaSb, GaInP and combinations thereof.

In alternative embodiments the WBG semiconductor material is Si1-xGex, where x is a real number between about 0 and 0.7, more preferably between about 0 and 0.5.

In other embodiments the WBG semiconductor material is selected from the group consisting of GaN, AlGaN, AlN and related materials having electronic band gaps above 3 eV. Using GaN, AlGaN, AlN as WBG materials in combination with Ge as NBG material has the additional advantage of employing established techniques for growing/depositing good quality layers and interfaces.

In embodiments of the present invention the semiconductor material with the second band gap is narrow band gap semiconductor (NBG).

Preferably, the NBG semiconductor material is selected from the group consisting of InGaAs, InGaSb, InAs, InAsP, InAsSb and combinations thereof.

In alternative embodiments of the present invention, the NBG semiconductor material is Si1-yGey, where y is a real number between about 0.3 and 1, more preferably between about 0.5 and 1.

In a specific embodiment the WBG semiconductor material is Si1-xGex, where x is a real number between about 0 and 0.7 and the NBG semiconductor material is Si1-yGey, where y is a real number between about 0.3 and 1 and where y>x.

In embodiments of the present invention the doped region comprises dopants. The dopants can be a n-type dopant (donor species) or a p-type dopant. More particularly the donor species can be Si. Alternatively, when the WBG/NBG materials are Si and/or Ge-comprising materials, the dopants can be selected from the group of B, As, P, Sb, Ga and combinations thereof.

The doped region can be a doping layer (9), or a uniformly doped region (11, 14), or a gradually doped region (12, 14) as illustrated in FIGS. 1(A), 2(A) and 3(A), respectively.

When the dopants are confined in a doping layer, the thickness of the doping layer can be lower than 3 nm and, more preferably, lower than 1 nm. The doping layer can be positioned anywhere in the self-aligned source and drain region, more preferably close to the interface with the barrier layer (4). Preferably, the concentration of the donor species/dopants in the doping layer is from about $10^{11}$ to $10^{13}$ atoms.cm$^{-2}$. More preferably the concentration of the donor species/dopants in the doping layer is higher than $10^{12}$ atoms.cm$^{-2}$, or even more preferably higher than about $5.10^{12}$ atoms.cm$^{-2}$. The high doping level of the source and drain regions improves further the source and drain resistance.

When the dopants are distributed uniformly over a substantial part of the source and drain regions, the concentration of dopants can range from $10^{17}$ to $10^{21}$ atoms.cm$^{-3}$. More preferably, the concentration of dopants can vary between $10^{18}$ to $2.10^{20}$ atoms.cm$^{-3}$.

In the particular embodiment of the gradually doped region, the highest concentration of dopants, a value at the upper end of the range mentioned in the preceding paragraph for the uniformly doped region (e.g. $2.10^{20}$ atoms.cm), is located at the upper surface of the source/drain regions.

In different embodiments of the present invention, the substrate (1), as shown in FIGS. 1 to 5, can be a bulk semiconductor substrate or a material stack comprising at least a semiconductor substrate. More preferably, the substrate (1) comprises Si, Ge, SiGe, Silicon on Insulator (SOI), Germanium on Insulator (GOI), GaAs.

In different embodiments of the present invention, the gate electrode (6) can comprise a conductive material like e.g. a metal, a metal alloy, a metal silicide, metal nitrides, a metal germanide, poly-silicon (poly_Si), poly-silicon-germanium and any combinations or multilayers thereof. Preferably, the gate conductor is a metal comprising at least one of the elements Al, Au, W or Ti. By selecting the material for the gate electrode one can advantageously determine the effective work function of the device and, thereby, the threshold voltage of the device.

In a particular embodiment of the present invention a n-type channel field effect transistor (NFET) quantum well device is disclosed comprising a substrate (1), a quantum well region (QW) overlying the substrate, a gate region (G) overlying the quantum well region, a source region (S) and a drain region (D) adjacent to the gate region, wherein
the quantum well region comprises:
 a buffer structure (2) overlying and in contact with the substrate (1), the buffer structure comprising a III-V compound semiconductor material having a first band gap,
 a channel structure (3) overlying and in contact with the buffer structure (2), comprising a III-V compound semiconductor material having a second band gap,
 a barrier layer (4) overlying and in contact with the channel structure (3), comprising an un-doped III-V compound semiconductor material having a third band gap,
wherein the first and the third band gap are wider than the second band gap, and
 the source region (S) and the drain region (D) are each self-aligned to the gate region (G) and comprises a III-V compound semiconductor material (8) having a fourth band gap and a doped region, wherein the fourth band gap is wider than the second band gap.

In a further embodiment a hybrid device is disclosed comprising a NFET (HEMT) quantum well device (I) as described in any of the preceding embodiments and a PFET (HHMT, high hole mobility transistor) quantum well device (II) comprising a Ge-channel structure. This embodiment is illustrated schematically in FIG. 5.

Figure 5:
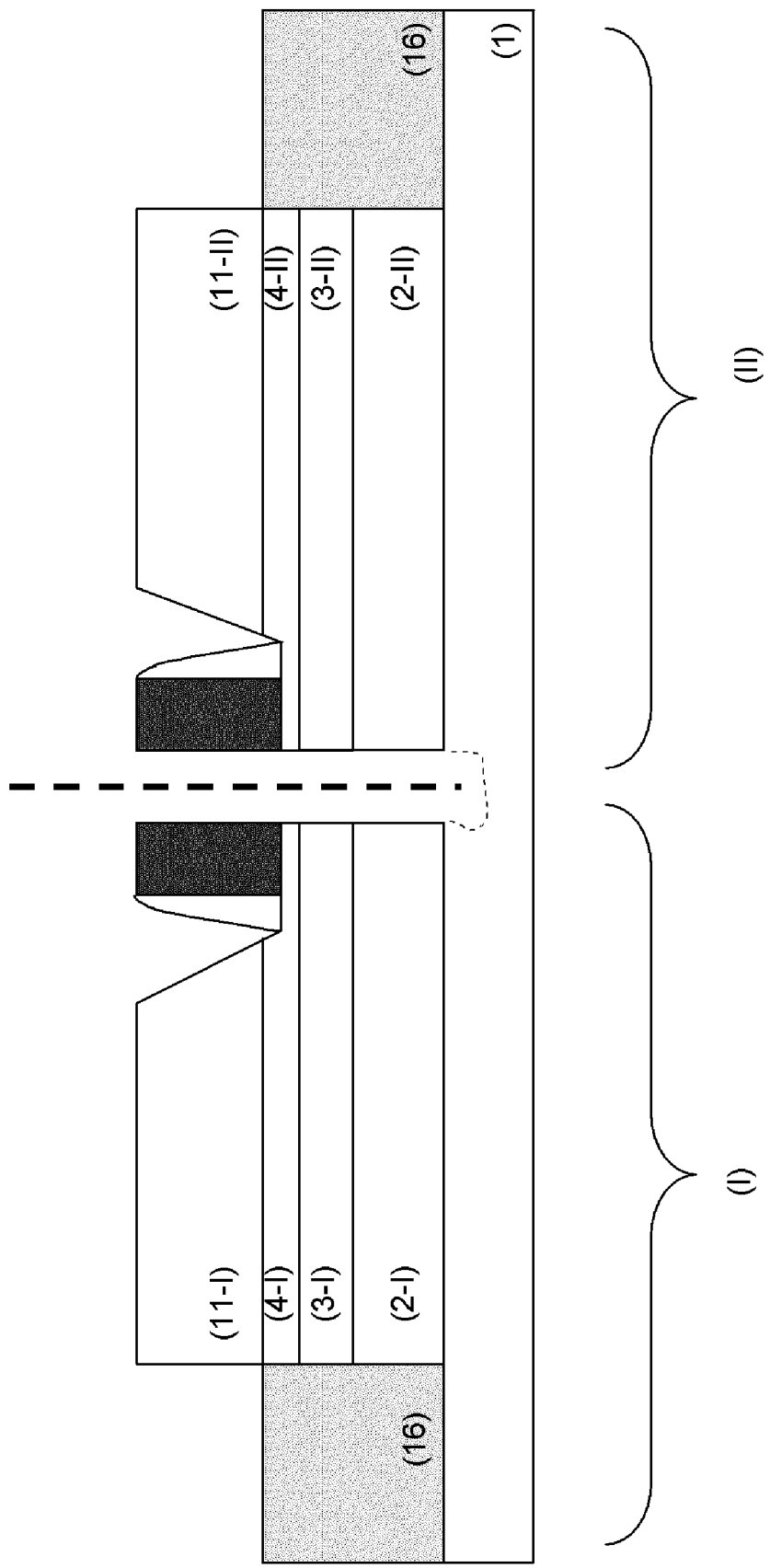
FIG. 5 represents schematically a hybrid QW device comprising a HEMT III-V QW device (I) as described in any of the embodiments represented in FIGS. 1 to 4 and a HHMT Ge-channel QW device (II), wherein: (1)—substrate; (2-I,2-II)—buffer structure; (3-I,3-II)—channel structure; (4-I,4-II)—barrier layer; (11-I,11-II)—selectively-grown S/D regions comprising a doped region; (16)—shallow trench isolation (STI) oxide.

In a particular embodiment represented in FIG. 5, the QW region of the HEMT device (I) comprises a buffer structure (2-I) comprising or consisting of GaAs, a channel structure (3-I) comprising or consisting of strained InGaAs and a barrier layer (4-I) comprising or consisting of InGaAlAs or InP. The self-aligned S/D regions (11) of the HEMT are selectively grown and comprise or consist of n-doped GaAs. The QW region of the HHMT device (II) comprises a buffer structure (2-II) comprising or consisting of SiGe, a channel structure (3-II) comprising or consisting of strained Ge and a barrier layer (4-II) comprising or consisting of a Si passivation layer. The self-aligned S/D regions (11') of the HHMT are selectively grown and comprise or consist of p-doped SiGe. Both devices are integrated on an e.g. Si substrate (1) and separated by shallow trench isolations (16).

Certain embodiments relate to a method of fabricating such quantum well devices. A method for producing a quantum well device is disclosed comprising
 providing a substrate,
 forming a quantum well region (QW) comprising
  forming a buffer structure (2) by epitaxial growth, the buffer structure overlying the substrate (1) and comprising a semiconductor material having a first band gap,
  forming a channel structure (3) by epitaxial growth, the channel structure overlying the buffer structure (2) and comprising at a semiconductor material having a second band gap,
  forming a barrier layer (4) by epitaxial growth, the barrier layer overlying the channel structure (3) and comprising an un-doped semiconductor material having a third band gap,
 wherein the first and the third band gap are wider than the second band gap, and
 forming a T-shaped (recessed) gate electrode on top of a portion of the barrier layer by defining a recess partially in the barrier layer (i.e. the depth of the recess is lower than the thickness of the barrier layer) and depositing a conductive material, forming a source contact and a drain contact on either side of the T-shaped gate electrode by etching trenches into the quantum well region and filling the trenches with a conductive material to contact the channel structure forming a δ-doping layer in the barrier layer on both sides of the gate electrode, but not in the portion under the gate electrode, by ion implantation or other suitable doping technique.

In a second aspect of the present invention a method for manufacturing a quantum well device with self-aligned source/drain regions is disclosed comprising providing a substrate (1), forming a quantum well region (QW) comprising forming a buffer structure (2) by epitaxial growth, the buffer structure overlying the substrate (1) and comprising a semiconductor material having a first band gap, forming a channel structure (3) by epitaxial growth, the channel structure overlying the buffer structure (2) and comprising at a semiconductor material having a second band gap, forming a barrier layer (4) by epitaxial growth, the barrier layer overlying the channel structure (3) and comprising an un-doped semiconductor material having a third band gap, wherein the first and the third band gap are wider than the second band gap, and forming a gate region (G) overlying a portion of the quantum well region (QW), and forming a source region (S) and a drain region (D) self-aligned to the gate region (G) by selective growth of a semiconductor material (8) having a fourth band gap wider than the second band gap, wherein each of the source region (S) and the drain region (D) comprises a doped region.

In some embodiments of the second aspect of the present invention, forming the gate region (G) further comprises forming a gate electrode (6) overlying a portion of the barrier layer (4) and forming a first pair of insulating sidewall spacers (7) on both sides of the gate electrode (6) as illustrated in FIG. 1(A). Forming the gate electrode (6) comprises depositing a layer or a multi-layer of a conductive material (gate electrode) overlying the barrier layer (4) and the lithographic patterning of the gate electrode using a photoresist material. A hard-mask layer, comprising e.g. Si-oxide or Si-nitride, can be interposed in between the gate electrode and the photoresist material. Advantageously, gate lengths (Lg) below 50 nm and, more preferably, below 25 nm are used.

Alternatively, the gate electrode (6) can be formed by a replacement gate process (not shown). The replacement gate process may consist in a damascene like processing, comprising: forming a sacrificial gate electrode in a 'gate first' process, encapsulating the gate electrode with insulating sidewall spacers, removing the sacrificial gate electrode, filling up the trench left by the selective removal of the sacrificial gate with the gate electrode material (i.e. metal), performing a chemical mechanical polishing (CMP) process. In this way, at the end of the replacement gate process, one retrieves the original dimensions of the gate, without ending-up with T-shape gate.

Forming a first pair of insulating sidewall spacers comprises depositing a layer of insulating material (e.g. Si-oxide, Si-nitride) and afterwards patterning the spacers (e.g. removing anisotropically the insulating material from the upper surface of the gate region and the source/drain regions selectively towards the underlying materials), such as insulating sidewall spacers (7) are formed on both sides of the gate electrode (6).

The width of the insulating sidewall spacers (wox) is lower or equal to 10 nm, more preferred lower or equal to 5 nm, on each side of the gate electrode. The minimum width/thickness is determined by the requirement to have a good insulation between the gate and the source/drain regions. The optimum width/thickness of the insulating sidewall spacers is determined, as shown by the simulations in Example 1 and FIG. 10 (a) and (b) by the maximum interruption in the δ-doping layer which does not have an influence on the channel doping, i.e. the series resistance Rs of the QW device.

In different embodiments of the second aspect of the present invention, the method further comprises, after the selective growth of the self-aligned source (S) and the drain (D) regions, forming a second pair of insulating sidewall spacers (15) overlying any faceted regions of the selectively grown source and drain regions near the gate edge (11b, 12b, 14b), and thereafter forming shallow self-aligned source and drain contacts (13, 13'). These embodiments are illustrated in FIGS. 2(C), 3(C) and 4(C).

The process of forming shallow self-aligned source and drain contacts involves depositing a thin metal layer overlying the source, drain and gate region, thereafter performing a thermal treatment, whereby the thin metal layer reacts with a superficial layer of the semiconductor material (11, 12, 14) at the upper surface of the source and the drain region (11a, 12a, 14a) forming a metal compound (e.g. a silicide, a germanide, a III-V metal compound), followed by removing selectively the un-reacted metal towards the metal-compound.

Selective growth of the source and the drain regions can be performed by selective epitaxial growth (SEG) techniques. During the selective epitaxial growth, faceting of the epitaxial grown material (the semiconductor material with the fourth band gap) can occur near i.e. the insulating sidewall spacers. This faceting causes the thickness of the elevated source/drain regions to be thinner near the edge of the insulating material resulting in device fabrication concerns. For example, during the formation of the S/D shallow contacts (silicidation, germanidation) local shorts can be formed between the S/D region and the gate region. To avoid such concerns a second pair of insulating sidewall spacers (15) are formed after the selective epitaxial growth.

In different embodiments of the second aspect of the present invention, the doped region (9, 11, 12, 14) is formed by in-situ doping during the selective epitaxial growth.

In alternative embodiments of the second aspect, the doped region (9, 11, 12, 14) is formed by implantation after the selective epitaxial growth.

In some embodiments of the second aspect of the present invention, the method to manufacture a QW device further comprises, after forming the gate region (G), forming recessed source and drains regions in the quantum well region (QW), by etching recesses on both sides of the gate region as shown in FIG. 4(A). Preferably, the recess depth (dr) is higher than the distance from the edge of the recess to the upper surface of the channel structure (3a) and lower than the distance from the edge of the recess to the bottom surface of buffer structure (1a).

In different embodiments of the second aspect of the present invention, the method further comprises patterning a gate dielectric (5) sandwiched in between the barrier layer (4) and the gate electrode (6) in the gate region (G) as shown in FIG. 1(B). Preferably, the gate dielectric is a high-k material (k value>kSiO2=3.9). Alternatively, the gate region of the QW device can comprise a passivation layer (not shown)

underlying the high-k material (5), wherein the passivation layer can be formed by e.g. performing a pre-treatment (cleaning/UV exposure/short deposition process) on the barrier layer In a particular embodiment of the second aspect of the present invention, a method for manufacturing a NFET quantum well device is discloses comprising providing a substrate (1), forming a quantum well region (QW) comprising
  forming a buffer structure (2) by epitaxial growth, the buffer structure overlying the substrate (1) and comprising a III-V compound semiconductor material having a first band gap,
  forming a channel structure (3) by epitaxial growth, the channel structure overlying the buffer structure (2) and comprising at a III-V compound semiconductor material having a second band gap,
  forming a barrier layer (4) by epitaxial growth, the barrier layer overlying the channel structure (3) and comprising an un-doped III-V compound semiconductor material having a third band gap,
  wherein the first and the third band gap are wider than the second band gap, and forming a gate region (G) overlying a portion of the quantum well region (QW), and forming a source region (S) and a drain region (D) self-aligned to the gate region (G) by selective growth of a III-V compound semiconductor material (8) having a fourth band gap wider than the second band gap, wherein each of the source region (S) and the drain region (D) comprises a doped region.

In different embodiments of the present invention the structures comprised in the QW region are deposited using an epitaxial deposition technique such as molecular beam epitaxy (MBE), metal-organic chemical vapor deposition (MOCVD), Metal-organic Vapor Phase Epitaxy (MOVPE) Low-Pressure Chemical Vapor Deposition (LPCVD), Ultra High Vacuum Chemical Vapor Deposition (UHV CVD) or Atmospheric Pressure Chemical Vapor Deposition (APCVD). The semiconductor materials comprised in the source/drain regions and in the re-grown source/drain regions are formed by selective deposition/growth. Typical examples of selective growth techniques include but are not limited to Molecular Beam Epitaxy (MBE), Metal-organic Chemical Vapor Deposition (MOCVD) or Metal-organic Vapor Phase Epitaxy (MOVPE).

In a particular embodiment of the second aspect of the present invention, a method to manufacture a hybrid QW device is disclosed, wherein the hybrid QW device comprises a HEMT device (I) having a III-V channel structure and a HHMT device (II) having a Ge channel structure formed on a Si-substrate by using a Si-compatible, gate-first process flow.

The Si-compatible process flow comprises:

(1) substrate fabrication, including forming Shallow Trench Isolation (STI) regions (2) forming the QW structure comprising/consisting of a buffer structure (2-I, 2-II), a channel structure (3-I,3-II) and a barrier layer (4-I, 4-II) by local growth of III-V compound material and, respectively, SiGe material on a Si substrate, (3) gate patterning and insulating sidewall spacers definition, (4) selectively forming (self-aligned) source/drain regions comprising a doped region and (5) forming source/drain contacts.

Example 1

This example shows that the delta (δ) doping layer under the gate of a high electron mobility transistor can be removed for a 10 nm gate. The resulting $V_T$ shift can be countered by increasing the sheet charge in the δ-doping layer. At the same time, the removal of the δ-doping layer allows to reduce the barrier thickness under the gate, resulting in increased gate control.

The influence of interrupting the HEMT δ-doping layer under the gate for the 22 nm node ($L_g$=10 nm) is demonstrated, based on TCAD simulations (Sentaurus™, Synopsys Inc.). Interrupting the δ-doping layer under the gate would allow the gate to be closer to the channel or, alternatively, allow for high-k gate stacks to be used instead of the AlGaAs barrier layer, hereby increasing gate control much like in ordinary MOSFETs.

TABLE 1

| structure | δ(cm - 2) | $L_g$(nm) | $h_{sp}$(nm) |
|---|---|---|---|
| Ref. | $3.10^{12}$ | — | 10 |
| A | $3.10^{12}$ | 18 | 10 |
| B | $9.10^{12}$ | 18 | 10 |
| C | $9.10^{12}$ | 18 | 7 |
| D | $9.10^{12}$ | 18 | 4 |

FIG. 6(a) is a schematic view of the Reference structure. This is a classical HEMT structure with a gate length Lg=10 nm. On a GaAs substrate, an In0.75Ga0.25As quantum well (QW) with a thickness of 7 nm is present. The gate is assumed to be a Schottky contact (ΦB=0.8 eV) and is separated from the QW by an AlGaAs barrier (spacer) layer (hsp=10 nm), which contains a continuous δ-doping layer, positioned 3 nm above the QW and has a thickness of 3 nm. Laterally, the gate is isolated with an oxide spacer (Wox=4 nm).

FIG. 6(b) presents an alternative HEMT structure, where the δ-doping layer is interrupted over a length Lδ. FIG. 6(c) shows another alternative HEMT structure, where the δ-doping layer is interrupted over a length Lδ and the EOT is lowered/reduced. The length of the interruption Lδ is equal to the sum of the gate length (Lg) and the insulating (oxide) spacers width (wox) on both sides of the gate.

The analysis of the alternative HEMT is based on five structures. The first one is a classical HEMT reference. Structure A is identical to the reference structure, except for an interruption of 18 nm in the δ-doping layer. The resulting VT shift (as explained in the following paragraph) is compensated by increasing the δ-doping sheet charge in structure B. Finally, structures C and D explore the effect of moving the gate closer to the channel (reducing the barrier thickness hsp), a possibility created by the removal of the δ-doping under the gate. Table 1 lists the important parameters for the investigated structures.

Figure 7:
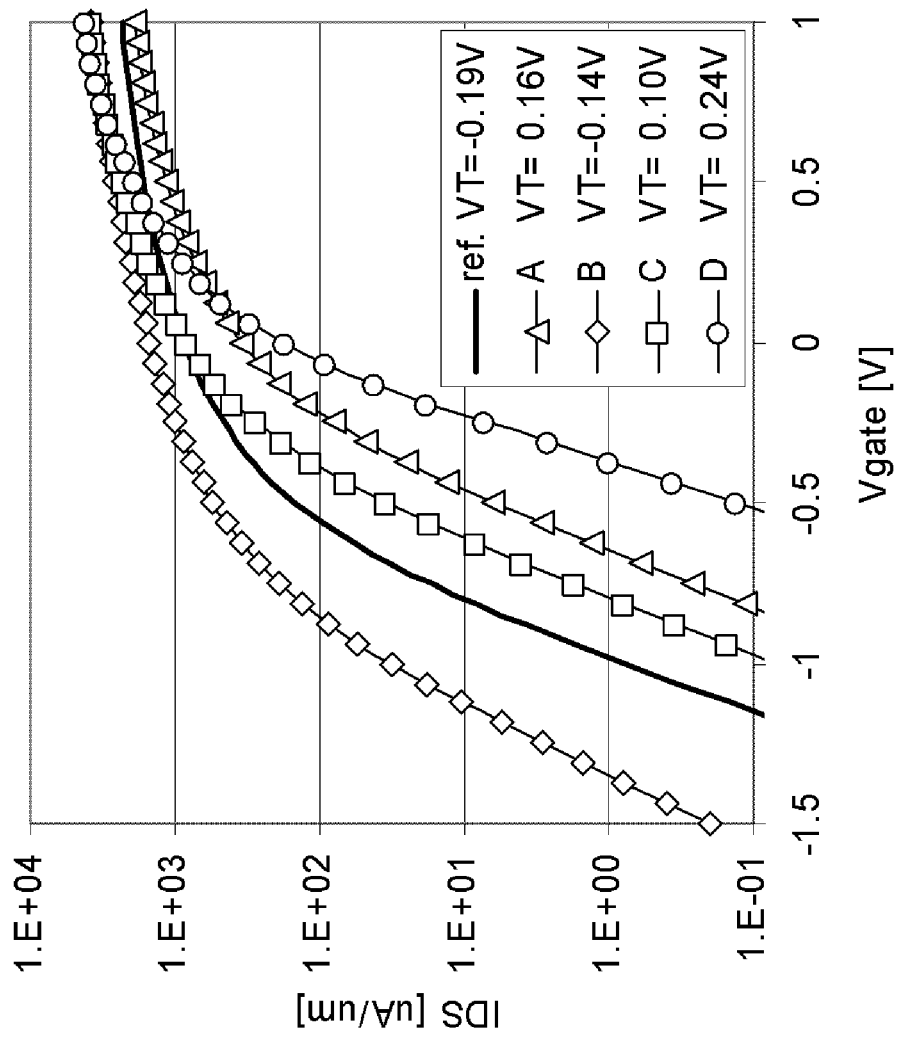
FIG. 7 represents the I-V curves for the various simulated structures (Ref, A-D in Table 1) for VDS=1 V. Linear VT was extracted at VDS=50 mV.

FIG. 7 shows the drain current in function of the gate voltage for VDS=1V. The (linear) VT for each structure, extracted with the max-gm method, is included in the legend. The reference HEMT has a VT of −0.19V. Removing the δ-doping layer under the gate and spacers (structure A) results in a VT increase of 350 mV. Lowering EOT in combination with removing the δ-doping layer results in a further VT increase (e.g. 430 mV for structure D with respect to the reference). The device with structure D functions in enhancement mode. This can be understood by considering that an interruption of the δdoping layer reduces the charge in the QW-channel. As a result, less negative charge on the gate is required to deplete the channel of electrons. To get the VT back to that of the reference structure, the δ-doping could be increased (structure B). As can be seen from FIG. 7, this does not result in identical subthreshold behavior for both structures. Additionally, the increased sheet charge results in higher on-currents for structure B.

The advantage of an interruption in the δ-doping layer is that it allows further scaling of the spacing between the gate and the QW-channel (barrier thickness, hsp). As shown in FIG. 7, decreasing hsp to 7 or 4 nm (structures C and D) clearly leads to better gate control in the subthreshold region. The subthreshold slope varies from 150 mv/dec in case of the reference structure, to 110 mV/dec for structure D with interrupted δ-doping and scaled EOT. This becomes even more obvious when looking at short channel effects in FIG. 8.

Figure 8:
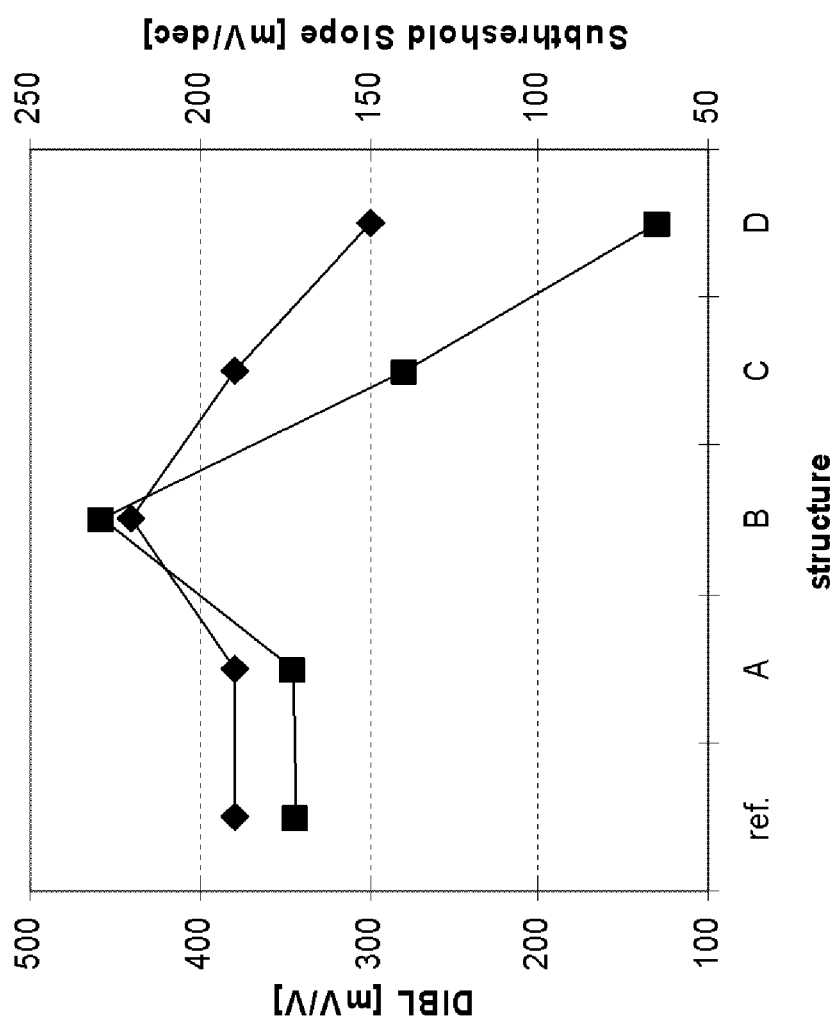
FIG. 8 represents Drain Induced Barrier Lowering (DIBL, mv/V) and subthreshold slope (SS, mV/dec), evaluated at VDD=1V.

FIG. 8 represents the Drain Induced Barrier Lowering (DIBL, mV/V, data points labelled with square (■)) and the subthreshold slope (SS, mV/dec, data points labelled with diamond (♦)), measured at VDD=1V for the different structures investigated (Ref, A-D). DIBL is a measure of the change in the threshold voltage VT of the device as a result of change in VDS. Small DIBL values reflect a good VT stability to manufacturing variations. Moreover, DIBL and subthreshold slope give a measure of the overall electrostatic integrity of the device. In comparison to both the reference and structure B, DIBL and subthreshold slope (SS) are significantly improved for the structures with reduced barrier thickness, hsp (C and D).

Figure 9:
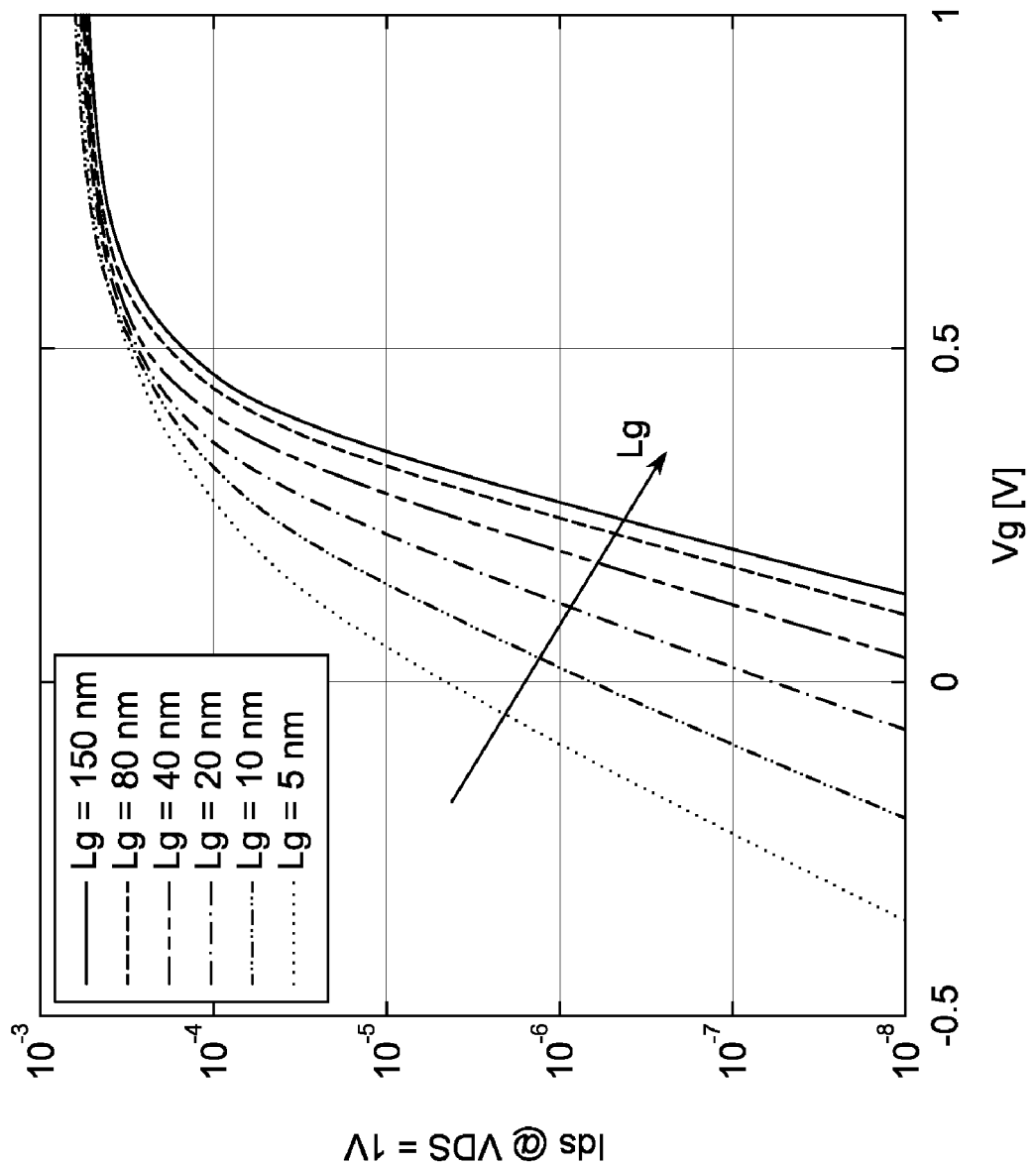
FIG. 9 represents the Ids-Vg curves for the various simulated gate lengths (Lg) of the device structure with interrupted doping layer and scaled EOT, at VDS=1V.

FIG. 9 represents the Ids-Vg curves for the various simulated gate lengths (Lg) at VDS=1V for the device structure with interrupted doping layer and scaled EOT. The δ-doping layer has a sheet charge of 3.1012 atoms .cm−2 and the insulator sidewall spacers have a width of 4 nm on each side of the gate. Ion is determined by the gate channel functioning in accumulation mode, while the Ioff is determined by depletion and the interrupted doping. As FIG. 9 shows, there is no penalty in Ion for Lg<150 nm, which confirms that for device architectures with interrupted doping layer the Lg is not a critical design factor.

Figure 10A:
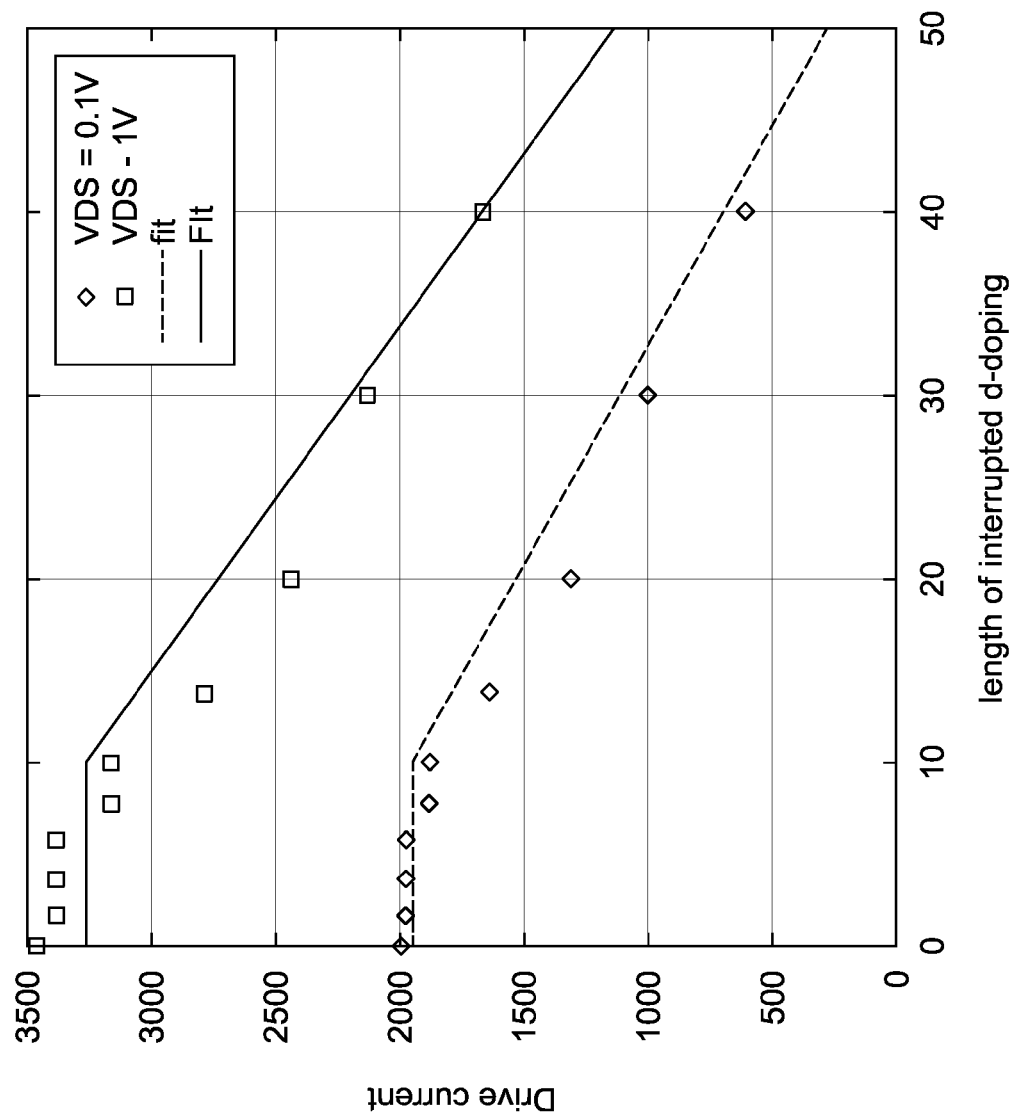
FIG. 10 (*a*) represents the results of the simulations of the drive current as function of the length of the δ-doping interruption (the spacers width)
Figure 10B:
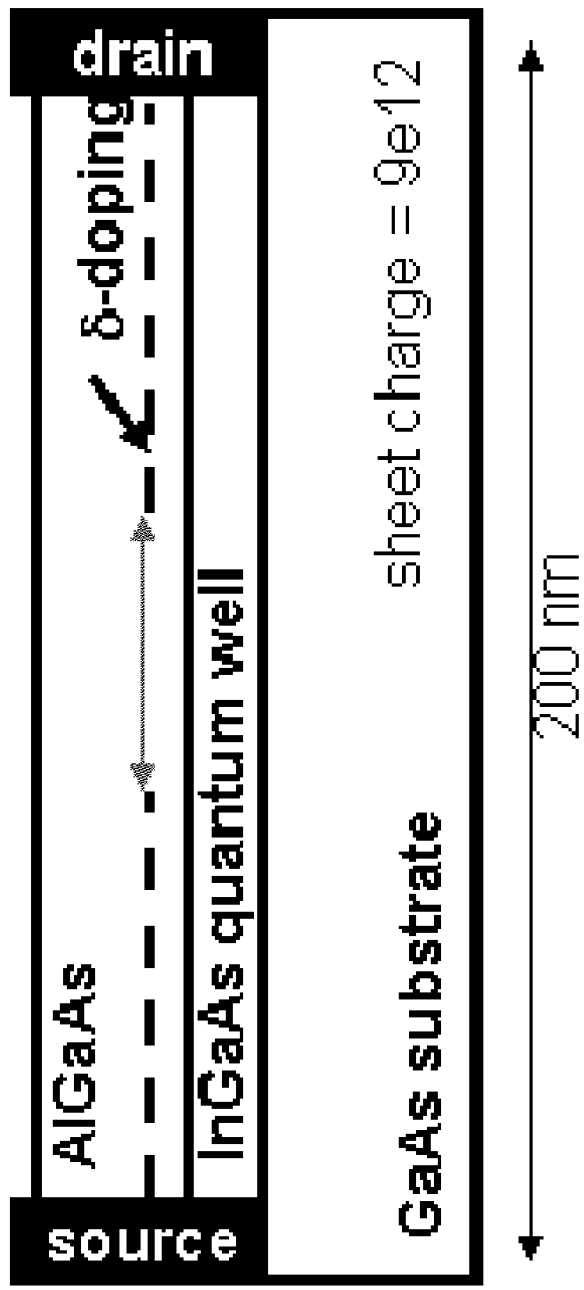

FIG. 10 (a) represents the results of the simulations for the optimum spacer thickness/width. The effect of various spacer thicknesses was simulated with a device without a gate (only with an interrupted doping) as the structure represented in FIG. 10 (b).

Underneath the (first pair of) insulating spacers there is no gate control and no charge supplied by the δ-doping. Therefore the series resistance Rs of the QW device will become too high above a certain value of the spacers width wox. The simulations shown that an interruption of the δ-doping of 10 nm or less does not influence channel doping and, consequently, the series resistance of the QW device.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A quantum well device comprising:
   a buffer structure over a substrate, the buffer structure comprising a semiconductor material having a first band gap;
   a channel structure over the buffer structure, the channel structure comprising a semiconductor material having a second band gap;
   a barrier structure over the channel structure, the barrier structure comprising a semiconductor material having a third band gap and further comprising a doping material suitable for forming a 2-dimensional carrier gas;
   a gate region over a portion of the barrier structure, the gate region comprising a gate electrode;
   a source contact; and
   a drain contact,
   wherein the first and the third band gap are wider than the second band gap, and wherein no doping material is present in the portion of the barrier structure located underneath the gate region.

2. The device according to claim 1, wherein the barrier structure comprises:
   a barrier layer over the channel structure, the barrier layer comprising an undoped semiconductor material having the third band gap, wherein the buffer structure, the channel structure, and the barrier layer together form a quantum well region; and
   a source region and a drain region adjacent to the gate region, the source and drain regions being each self-aligned to the gate region and wherein the source and drain region comprise a semiconductor material having a fourth band gap and a doped region, wherein the fourth band gap is wider than the second band gap.

3. The device of claim 2, wherein the doped region comprises a doping layer.

4. The device of claim 2, wherein the doped region is uniformly doped.

5. The device of claim 2, wherein the doped region is gradually doped, with the highest dopants concentration at the upper surface.

6. The device of claim 2, wherein the barrier layer has a thickness between about 3 Angstrom and 2 nm.

7. The device of claim 2, wherein the source region and the drain region comprise recessed regions defined by a recess in the quantum well region, and wherein the depth of the recess is higher than the distance from the edge of the recess to the upper surface of the channel structure and lower than the distance from the edge of the recess to the bottom surface of the buffer structure.

8. The device of claim 2, further comprising a gate dielectric sandwiched in between the barrier layer and the gate electrode in the gate region.

9. The device of claim 1, wherein the gate region comprises a gate electrode over a portion of the barrier structure and a first pair of insulating sidewall spacers.

10. The device of claim 9, wherein the width of each insulating sidewall spacer is lower than or equal with about 5 nm.

11. A n-type channel field effect transistor quantum well device comprising: a quantum well region over a substrate; a gate region over a portion of the quantum well region; a source region and a drain region adjacent to the gate region, wherein the quantum well region comprises: a buffer structure over the substrate, the buffer structure comprising a III-V compound semiconductor material having a first band gap, a channel structure over the buffer structure, the channel structure comprising a III-V compound semiconductor material having a second band gap, a barrier layer over the channel structure, the barrier layer comprising an un-doped III-V compound semiconductor material having a third band gap, wherein the first and the third band gap are wider than the second band gap, and the source region and the drain region are each self-aligned to the gate region and comprises a III-V compound semiconductor material having a fourth band gap and a doped region, wherein the fourth band gap is wider than the second band gap, and wherein no doping material is present in the portion of the barrier structure located underneath the gate region.

* * * * *